United States Patent
Doi et al.

(10) Patent No.: US 7,010,729 B2
(45) Date of Patent: *Mar. 7, 2006

(54) TIMING GENERATOR AND TEST APPARATUS

(75) Inventors: Masaru Doi, Tokyo (JP); Shinya Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 89 days.

This patent is subject to a terminal disclaimer.

(21) Appl. No.: 10/842,188

(22) Filed: May 10, 2004

(65) Prior Publication Data

US 2004/0208048 A1    Oct. 21, 2004

Related U.S. Application Data

(63) Continuation of application No. PCT/JP02/11610, filed on Nov. 7, 2002.

(30) Foreign Application Priority Data

Nov. 8, 2001    (JP)    ............................. 2001-342955

(51) Int. Cl.
G06F 11/00    (2006.01)
G11B 20/18    (2006.01)
G01R 13/32    (2006.01)
G01R 13/26    (2006.01)

(52) U.S. Cl. ...................... 714/700; 714/744; 324/765; 702/69

(58) Field of Classification Search ................. 714/700
See application file for complete search history.

(56) References Cited

U.S. PATENT DOCUMENTS

| | | | |
|---|---|---|---|
| 5,761,100 A | 6/1998 | Itoh et al. | |
| 6,058,057 A | 5/2000 | Ochiai et al. | |
| 6,377,065 B1 * | 4/2002 | Le et al. | 324/765 |
| 6,479,983 B1 * | 11/2002 | Ebiya | 324/158.1 |
| 6,549,000 B1 * | 4/2003 | Ebiya | 324/158.1 |
| 2004/0251914 A1 * | 12/2004 | Doi et al. | 324/537 |

FOREIGN PATENT DOCUMENTS

| | | |
|---|---|---|
| JP | 11-352198 | 12/1999 |
| JP | 6-324118 | 11/2000 |
| WO | WO 00/40984 | 7/2000 |

OTHER PUBLICATIONS

"A Dynamically Tracking Clock Distribution Chip with Skew Control" by Chengson et al. in 1990 Proceedings of the IEEE Custom Integrated Circuits Conference Publication Date: May 13-16, 1990 pages): 15.6/1-15.6/4 NSPEC Accession No.: 3863856.*

(Continued)

Primary Examiner—Albert Decady
Assistant Examiner—Cynthia Britt
(74) Attorney, Agent, or Firm—Osha-Liang LLP

(57) ABSTRACT

A timing generator includes a reference clock generating unit for outputting a reference clock at a predetermined time interval, a first variable delay circuit unit for receiving the reference clock and outputting a first delay signal which results from delaying the reference clock, a second variable delay circuit unit for receiving the reference clock and outputting a second delay signal which results from delaying the reference clock, a delay control unit for controlling delay amounts of the first and second variable delay circuit units, and a timing generating unit for generating the timing signal based on the first and second delay signals, wherein the first and second delay control units increase or decrease the delay amounts of the first and second variable delay circuit units to be increased or decreased whenever the reference clock generating unit generates the reference clock.

14 Claims, 8 Drawing Sheets

OTHER PUBLICATIONS

Patent Abstracts of Japan, Publication No. 06-324118 dated Nov. 25, 1994, 1 pg.

Patent Abstracts of Japan, Publication No. 11-352198 dated Dec. 24, 1999, 1 pg.

International Search Report mailed Feb. 25, 2003 for International Publication No. PCT/JP02/11610, 3 pgs.

* cited by examiner

| MULTI STROBE OFFSET DATA | | | | |
|---|---|---|---|---|
| PRESENT CYCLE MUTCMD1 | PREVIOUS CYCLE MUTCMD1 | PRESENT CYCLE MUTCMD2 | PREVIOUS CYCLE MUTCMD2 | OFFSET DATA |
| 0 | 0 | 0 | 0 | PREVIOUS VALUE |
| 0 | 1 | | | PREVIOUS VALUE + RESOLUTION DATA |
| 1 | 0 | | | PREVIOUS VALUE + RESOLUTION DATA |
| 1 | 1 | | | PREVIOUS VALUE + RESOLUTION DATA × 2 |
| 0 | × | 0 | 1 | 0 |
| 1 | × | | | RESOLUTION DATA |
| × | × | 1 | 0 | 0 |
| × | × | 1 | 1 | 0 | ically in the present invention.

TIMING GENERATOR AND TEST APPARATUS

The present application is a continuation application of PCT/JP02/11610 filed on Nov. 7, 2002, which claims priority from a Japanese patent application No. 2001-342955 filed on Nov. 8, 2001, the entire contents of which are incorporated herein by reference for all purposes.

BACKGROUND OF THE INVENTION

1. Field of the Invention

The present invention relates to a timing generator for generating a timing signal and a test apparatus thereof.

2. Related Art

Recently, the trend towards a high speed electronic device such as a semiconductor device is considerable. For example, if there is jitter in the internal clock of a high speed memory device such as DDR-SDRAM, the jitter component is inevitably included in both the output data of the device and the data strobe which is a clock based on the internal clock and used for the transfer of the output data.

However, since the conventional test apparatus judges the quality of the electronic device by one measurement, it is difficult to judge accurately due to the jitter component in both the output signal and the data strobe. In addition, if the conventional test apparatus samples the output signal outputted by the electronic device at different timing, it is necessary to store the phase data for a plurality of sampling timing signals to be produced in the test apparatus to shift the phases of the sampling timing signals by very small time intervals. Accompanying the recent trend towards a high speed semiconductor device which is a device under test, the search resolution of the sampling timing requires high resolution. Since the conventional test apparatus stores the phase data for a plurality of sampling timing signals to be produced in the test apparatus, it is necessary to store enormous amounts of phase data in the test apparatus to achieve high resolution. However, since it is impractical that a memory for storing such enormous amounts of phase data is provided in the test apparatus and besides storing all of the phase data of the sampling timing signals to be produced is nearly impossible, so it is difficult to test the electronic device highly accurately. Accordingly, it is desirable that a plurality of sampling timing signals whose phases are shifted by very small time intervals should be easily produced.

SUMMARY OF THE INVENTION

Accordingly, it is an object of the present invention to provide a timing generator and a test apparatus, which is capable of overcoming the above drawbacks accompanying the conventional art. The above and other objects can be achieved by combinations described in the independent claims. The dependent claims define further advantageous and exemplary combinations of the present invention.

In order to solve the problems above, according to the first aspect of the present invention, a timing generator for generating a timing signal includes a reference clock generating unit for outputting a reference clock at a predetermined time interval, a first variable delay circuit unit for receiving the reference clock and outputting a first delay signal which results from delaying the reference clock, a second variable delay circuit unit for receiving the reference clock and outputting a second delay signal which results from delaying the reference clock, a first delay control unit for controlling a delay amount of the first variable delay circuit unit, a second delay control unit for controlling a delay amount of the second variable delay circuit unit, and a timing generating unit for generating the timing signal based on the first and second delay signals, wherein the first and second delay control units calculate the delay amounts of the first and second variable delay circuit units to be calculated whenever the reference clock generating unit generates the reference clock.

The timing generating unit may generate the timing signal based on a signal interleaved with the first and second delay signals. The first delay control unit may include a first basic timing data setting unit to which a first basic timing data is set in advance, a first multi-strobe resolution data setting unit to which a first multi-strobe resolution data is set in advance, a first multi-strobe data calculating unit for calculating first multi-strobe data based on the first multi-strobe resolution data in response to the reference clock, and a first variable delay calculating unit for calculating the delay amount by which the reference clock is to be delayed in the first variable delay circuit unit based on the first basic timing data and the first multi-strobe data, and the second delay control unit may include a second basic timing data setting unit to which a second basic timing data is set in advance, a second multi-strobe resolution data setting unit to which a second multi-strobe resolution data is set in advance, a second multi-strobe data calculating unit for calculating second multi-strobe data based on the second multi-strobe resolution data in response to the reference clock, and a second variable delay calculating unit for calculating the delay amount by which the reference clock is to be delayed in the second variable delay circuit unit based on the second basic timing data and the second multi-strobe data.

The first variable delay calculating unit may calculate the delay amount which results from adding the first multi-strobe data to the first basic timing data, and the second variable delay calculating unit may calculate the delay amount which results from adding the second multi-strobe data to the second basic timing data. The first variable delay calculating unit may calculate the delay amount which results from subtracting the first multi-strobe data from the first basic timing data, and the second variable delay calculating unit may calculate the delay amount which results from subtracting the second multi-strobe data from the second basic timing data.

The second delay control unit may further include a multi-strobe data storing unit for storing the second multi-strobe data calculated by the second multi-strobe data calculating unit, and a second multi-strobe resolution data adding unit for adding the second multi-strobe resolution data to the second multi-strobe data stored by the multi-strobe data storing unit whenever the reference clock generating unit generates the reference clock, the first delay control unit may further include a first multi-strobe resolution data adding unit for adding the first multi-strobe resolution data to the second multi-strobe data stored by the multi-strobe data storing unit whenever the reference clock generating unit generates the reference clock, the multi-strobe data storing unit may store the second multi-strobe data anew to which the second multi-strobe resolution data has been added by the second multi-strobe resolution data adding unit, the second variable delay calculating unit may calculate the delay amount by which the reference clock is delayed in the second variable delay circuit unit based on the second basic timing data and the second multi-strobe data stored by the multi-strobe data storing unit, and the first variable delay calculating unit may calculate the delay amount by which the reference clock is delayed in the first variable delay circuit unit based on the first basic timing data and the delay amount calculated by the first multi-strobe resolution data adding unit.

The first multi-strobe resolution data may be substantially half the second multi-strobe resolution data. The timing generator may further include means for setting the second multi-strobe data stored by the multi-strobe data storing unit to be zero based on the timing signal which is to be generated by the timing generator. The timing generator may further include means for setting new first basic timing data in the first basic timing data setting unit based on the timing signal which is to be generated by the timing generator, and means for setting new second basic timing data in the second basic timing data setting unit based on the timing signal which is to be generated by the timing generator. The timing generator may further include means for setting new first multi-strobe resolution data in the first multi-strobe resolution data setting unit based on the timing signal which is to be generated by the timing generator, and means for setting new second multi-strobe resolution data in the second multi-strobe resolution data setting unit based on the timing signal which is to be generated by the timing generator.

According to the second aspect of the present invention, a test apparatus for testing an electronic device includes a pattern generating unit for generating a test pattern to test the electronic device, a waveform formatting unit for receiving the test pattern and inputting an formatted pattern which results from formatting the test pattern to the electronic device, a first timing generator for generating a timing signal, an output signal sampling circuit for sampling an output signal outputted by the electronic device in response to the test pattern at timing based on the timing signal generated by the first timing generator, and a judging unit for judging quality of the electronic device based on a sampling result of the output signal sampling circuit, wherein the first timing generator includes a reference clock generating unit for outputting a reference clock at a predetermined time interval, a first variable delay circuit unit for receiving the reference clock and outputting a first delay signal which results from delaying the reference clock, a second variable delay circuit unit for receiving the reference clock and outputting a second delay signal which results from delaying the reference clock, a first delay control unit for controlling a delay amount of the first variable delay circuit unit, a second delay control unit for controlling a delay amount of the second variable delay circuit unit, and a first timing generating unit for generating the timing signal based on the first and second delay signals, wherein the first and second delay control units increase or decrease the delay amounts of the first and second variable delay circuit units to be calculated whenever the reference clock generating unit generates the reference clock.

The judging unit may include means for calculating jitter of the output signal based on the sampling result of the output signal sampling circuit, and judge quality of the electronic device further based on the jitter of the output signal. The test apparatus may further include a second timing generator for generating a timing signal, and a data strobe sampling circuit for sampling a data strobe at timing based on the timing signal generated by the second timing generator, wherein the electronic device may output the output signal in response to an internal clock, the output signal sampling circuit may receive the output signal in response to the data strobe which is a clock based on the internal clock, the second timing generator may includes a third variable delay circuit unit for receiving the reference clock and outputting a third delay signal which results from delaying the reference clock, a fourth variable delay circuit unit for receiving the reference clock and outputting a fourth delay signal which results from delaying the reference clock, a third delay control unit for controlling a delay amount of the third variable delay circuit unit, a fourth delay control unit for controlling a delay amount of the fourth variable delay circuit unit, and a second timing generating unit for generating the timing signal based on the third and fourth delay signals, the third and fourth delay control units increase or decrease the delay amounts of the third and fourth variable delay circuit units to be calculated whenever the reference clock generating unit generates the reference clock, and the judging unit judges quality of the electronic device further based on a sampling result of the data strobe sampling circuit. The judging unit may further include means for calculating jitter of the data strobe based on the sampling result of the data strobe sampling circuit, and judge quality of the electronic device further based on the jitter of the data strobe.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
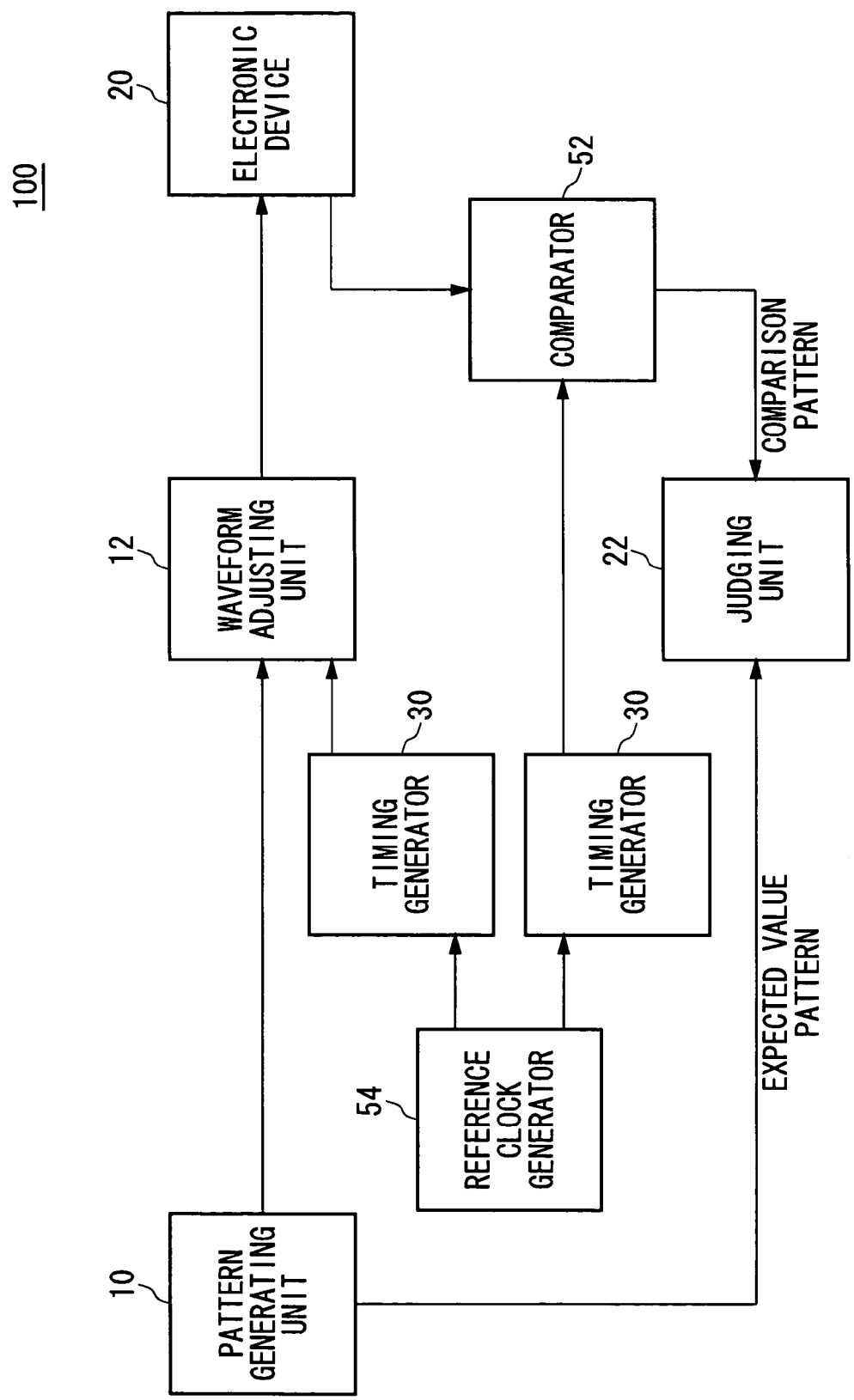
FIG. 1 shows an example of the configuration of a test apparatus according to the present invention.

FIG. 1 shows an example of the configuration of a test apparatus 100 according to the present invention. The test apparatus 100 includes a reference clock generating unit 54 for generating a reference clock, a pattern generating unit 10 for generating a test pattern synchronously with the reference clock, a timing generator 30 for generating a timing signal based on the reference clock, a waveform formatting unit 12 for generating an formatted pattern which results from formatting the test pattern and inputting the formatted pattern to the electronic device 20 at the timing based on the timing signal generated by the timing generator 30, a comparator 52 for obtaining a comparison pattern which is the pattern of an output signal outputted by the electronic device 20 at the timing based on the timing signal generated by the timing generator 30, and a judging unit 22 for judging the quality of the electronic device 20 based on the comparison pattern and the expected value pattern.

The pattern generating unit 10 generates the test pattern for the test of the electronic device 20 and the expected value pattern outputted by the electronic device 20 when the test pattern is inputted into the electronic device 20. The waveform formatting unit 12 generates the formatted pattern which results from formatting the test pattern and inputs the formatted pattern to the electronic device 20 based on the timing signal generated by the timing generator 30. For example, the waveform formatting unit 12 delays the formatted pattern based on the timing signal generated by the timing generator 30 and inputs it to the electronic device 20. The comparator 52 obtains the value of the output signal outputted by the electronic device 20 based on the inputted formatted pattern based on the timing signal generated by the timing generator 30. The timing generator 30 generates a plurality of timing signals, and the comparator obtains the pattern of the output signal based on the timing signals generated by the timing generator 30 and generates the comparison pattern. The judging unit 22 judges the quality of the electronic device 20 based on the comparison pattern and the expected value pattern.

In this embodiment, the timing generator 30 generates a plurality of timing signals. For example, a plurality of clocks are inputted from the reference clock generating unit 54 to the timing generator 30, and the timing generator 30 delays a different delay amount clock whenever the clock is inputted and inputs it to the waveform formatting unit 12 or the comparator 52. For example, the timing generator 30 generates a multi-strobe by gradually increasing or decreasing the delay amount which results from delaying the clock whenever the clock is inputted. The timing generator 30 for supplying the timing signal to the waveform formatting unit 12 and the timing generator 30 for supplying the timing signal to the comparator 52 may have the same function and configuration. The timing generator 30 may include means for setting the resolution of the multi-strobe so as to calculate the delay amount based on the determined resolution of the multi-strobe whenever the clock is inputted. For example, the timing generator 30 may calculate the delay amount to which the resolution of the multi-strobe is added whenever the clock is inputted and delays and outputs the inputted clock based on the calculated delay amount. According to the test apparatus 100 described in this embodiment, since the delay amount is calculated based on the determined resolution of the multi-strobe, it is unnecessary to store the setting value of the timing for each multi-strobe to be generated by the timing generator 30, and the deficiency in the storage capacity of the test apparatus 100 can be solved. Hereinafter, the configuration and operation of the timing generator 30 will be described.

Figure 2:
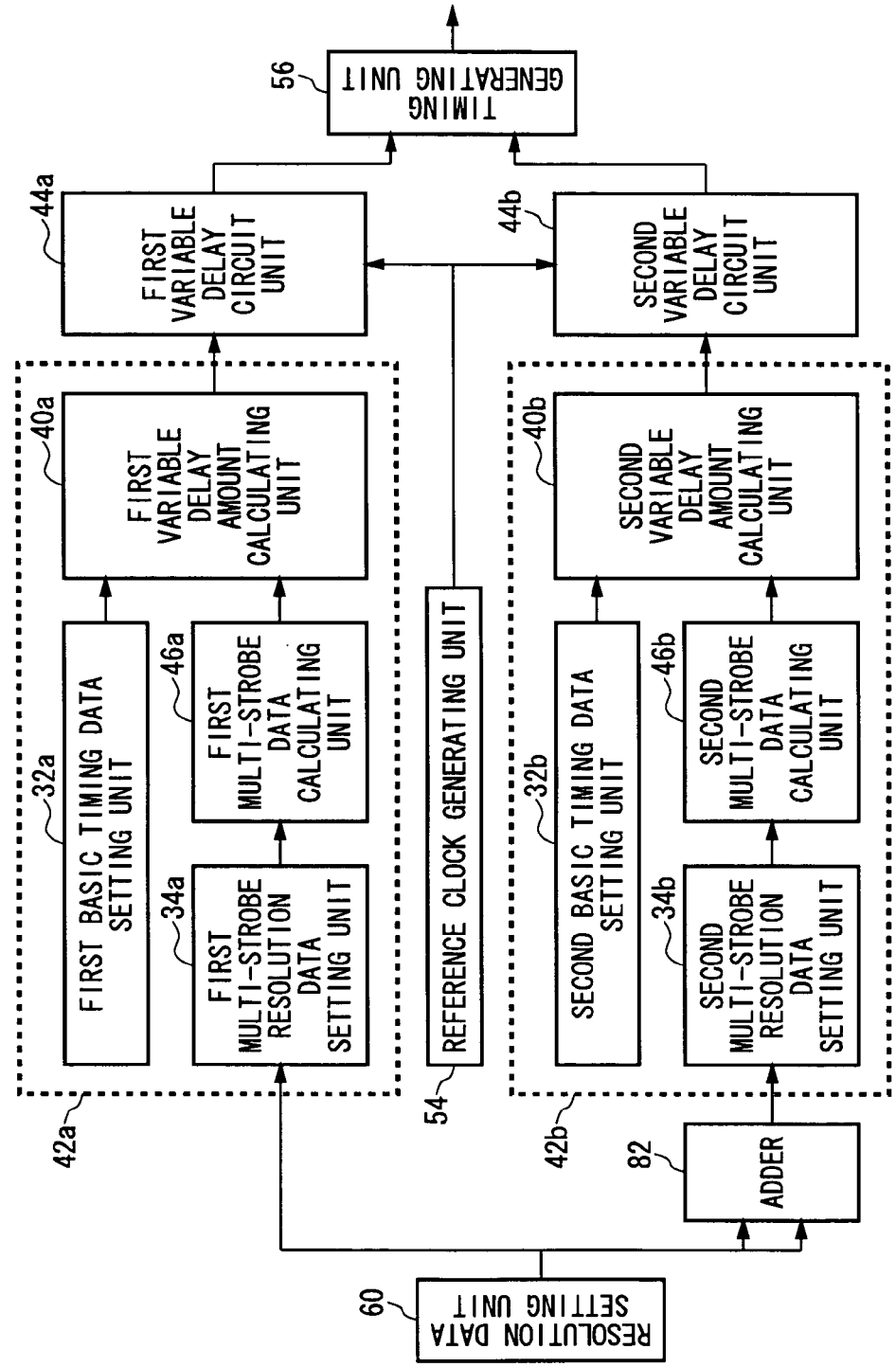
FIG. 2 is a block diagram showing an example of the configuration of a timing generator of this embodiment.

FIG. 2 is a block diagram showing an example of the configuration of the timing generator 30 of this embodiment. The timing generator 30 includes a timing generator 30, first and second variable delay circuit units 44a and 44b, first and second delay control units 42a and 42b, a resolution data setting unit 60, a reference clock generating unit 54, an adder 82, and a timing generating unit 56.

The reference clock generating unit 54 generates the reference clock at a predetermined time interval. The first and second variable delay circuit units 44a and 44b receive the reference clock, and output first and second delay signals which result from delaying the reference clock to the timing generating unit 56.

The first delay control unit 42a controls the delay amount of the first variable delay circuit unit 44a, and the second delay control unit 42b controls the delay amount of the second variable delay circuit unit 44b. The timing generating unit 56 generates the timing signal based on the first and second delay signals. The first and second delay control units 42a and 42b calculate and increase or decrease the delay amounts of the first and second variable delay circuit units 44a and 44b whenever the reference clock generating unit 54 generates the reference clock.

The resolution data setting unit 60 supplies a value based on a reference value which is given as the resolution of the multi-strobe generated by the timing generator 30 to the first and second delay control units 42a and 42b. Hereinafter, the configurations and operation of the first and second delay control units 42a and 42b will be described.

The first and second delay control units 42a and 42b may have the same function and configuration. Each of the first and second delay control units 42a and 42b includes a basic timing data setting unit 32 for setting the basic timing data in advance, a multi-strobe resolution setting unit 34 for setting the multi-strobe resolution data in advance, a multi-strobe data calculating unit 46 for calculating the multi-strobe data based on the multi-strobe resolution data in response to the reference clock, and a variable delay calculating unit 40 for calculating the delay amount by which the reference clock is to be delayed in the variable delay circuit unit 44 based on the basic timing data and the multi-strobe data. The second multi-strobe resolution data setting unit 34b receives the data indicating a value which is twice the reference value from the resolution data setting unit 60 via the adder 82. Meanwhile, the first multi-strobe resolution data setting unit 34a receives the data which indicates a value substantially the same as the reference value from the resolution data setting unit 60. In other words, the first multi-strobe resolution data setting unit 34a sets the data which is substantially half the data of the second multi-strobe resolution data setting unit 34b. Hereinafter, the function of the first delay control unit 42a will be described.

The first multi-strobe data calculating unit 46a preferably calculates the first multi-strobe data synchronously with the reference clock. In addition, the first multi-strobe data calculating unit 46a may calculate the first multi-strobe data whenever the reference clock generating unit 54 generates the reference clock. The first variable delay amount calculating unit 40a may control the delay amount by which the reference clock is to be delayed by the first variable delay circuit unit 44a based on the first multi-strobe data calculated in response to the reference clock and the first basic timing data. In addition, the first multi-strobe data calculating unit 46a preferably calculates the first multi-strobe data to which the substantially equal delay amount is added whenever the reference clock generating unit 54 generates the reference clock. For example, the first multi-strobe data calculating unit 46a preferably calculates the first multi-strobe data to which the first multi-strobe resolution data is added whenever the reference clock generating unit 54 generates the reference clock. And the first multi-strobe resolution data setting unit 34a can preferably set the multi-strobe resolution data which is different from that of the second multi-strobe resolution data setting unit 34b. For example, the first multi-strobe resolution data setting unit 34a sets the data whose value is substantially half the value of the data of the second multi-strobe resolution data setting unit 34b.

The first variable delay amount calculating unit 40a may calculate the delay amount which results from adding the first multi-strobe data to the first basic timing data. When the second variable delay calculating unit 40b calculates the delay amount which results from adding the second multi-strobe data to the second basic timing data, the first variable delay calculating unit 40*a* preferably calculates the delay amount which results from adding the first multi-strobe data to the first basic timing data. And the first variable delay amount calculating unit 40*a* may calculate the delay amount which results from subtracting the first multi-strobe data from the first basic timing data. When the second variable delay calculating unit 40*b* calculates the delay amount which results from subtracting the second multi-strobe data from the second basic timing data, the first variable delay calculating unit 40*a* preferably calculates the delay amount which results from subtracting the first multi-strobe data from the first basic timing data.

In addition, the first delay control unit 42*a* may further include means for determining whether the first variable delay amount calculating unit 40*a* calculates the delay amount which results from adding the first multi-strobe data to the first basic timing data or subtracting the first multi-strobe data from the first basic timing data. Since the calculation method of the first and second variable delay amount calculating units 40*a* and 40*b* is selected, the change direction of the phase of the timing generated by the timing generator 30 can be controlled. In other words, whether the phase of the timing is shifted in the positive or negative direction of the time axis with regard to the output signal outputted by the electronic device 20 can be selected so as to generate the timing signal. And although each of the first and second delay control units 42*a* and 42*b* includes the basic timing data setting unit in this embodiment, alternatively the test apparatus 100 may include a basic timing data setting unit for setting the basic timing data in the first and second delay control units 42*a* and 42*b*. The basic timing data may be the same with regard to the first and second delay control units 42*a* and 42*b*. Hereinafter, the configuration and operation of the timing generator 30 will be described.

Figure 3:
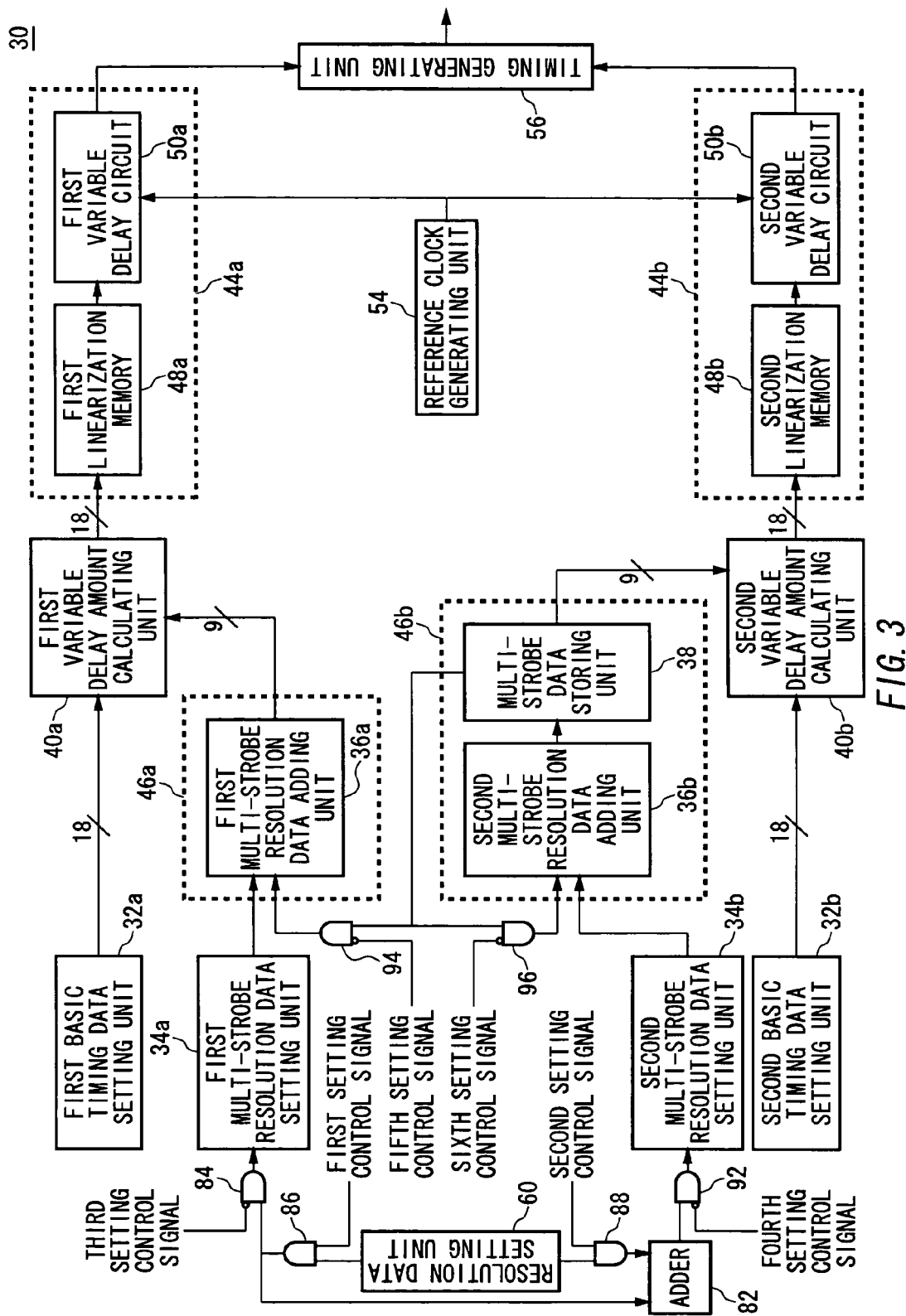
FIG. 3 shows an example of the configuration of the timing generator.

FIG. 3 shows an example of the configuration of the timing generator 30. In FIG. 3 matters given by the same symbols as those in FIG. 2 may have the same function and configuration with those in FIG. 2. The timing generator 30 includes first and second variable delay circuit units 44*a* and 44*b*, first and second delay control units 42*a* and 42*b* (cf. FIG. 2), a resolution data setting unit 60, an adder 82, a reference clock generating unit 54, and a timing generating unit 56. The first and second variable delay circuit unit 44*a* and 44*b* includes a variable delay circuit 50 and a linearization memory 48. The variable delay circuit 50 may include a plurality of delay elements so that it generates the delay amount by any combination of the delay elements. The linearization memory 48 selects the combination of the delay elements of the variable delay circuit 50 based on the delay amount to be delayed by the variable delay circuit 50. The linearization memory 48 may include a memory for storing the signal transmission route of the variable delay circuit 50 based on the delay amount used by the variable delay circuit 50. The linearization memory 48 receives a trigger to control the operation of the linearization memory 48. The trigger may be the reference clock.

The first delay control unit 42*a* includes a first basic timing data setting unit 32*a*, a first multi-strobe resolution data setting unit 34*a*, a first variable delay amount calculating unit 40*a*, and a first multi-strobe data calculating unit 46*a*. In this embodiment, the first multi-strobe data calculating unit 46*a* includes a first multi-strobe resolution data adding unit 36*a* and a first multi-strobe data storing unit 38*a*.

The second delay control unit 42*b* includes a second basic timing data setting unit 32*b*, a second multi-strobe resolution data setting unit 34*b*, a second variable delay calculating unit 40*b*, and a second multi-strobe data calculating unit 46*b*. In this embodiment, the second multi-strobe data calculating unit 46*b* includes a second multi-strobe resolution data adding unit 36*b*.

In this embodiment, the first and second delay control units 42*a* and 42*b* may include digital circuits for controlling the delay amounts of the first and second variable delay circuit units 40*a* and 40*b* by digital signals. In this embodiment, the first and second delay control units 42*a* and 42*b* control the delay amounts of the first and second variable delay circuit units 40*a* and 40*b* by 18-bit digital signals.

The resolution data setting unit 60 is given the resolution data which is a predetermined reference value, and the second multi-strobe resolution data setting unit 34*b* receives the data based on the resolution data from the resolution data setting unit 60 via the adder 82. As shown in FIG. 3, the adder 82 adds the outputs of digital circuits 86 and 88, and supplies it to a digital circuit 84. That is, in this embodiment, the second multi-strobe resolution data setting unit 34*b* stores the data which indicates a value substantially twice the reference value. And the first multi-strobe resolution data setting unit 34*a* stores the data which indicates a value substantially the same as the reference value. The digital circuits 86, 88, 84, and 92 shown in FIG. 3 may be AND circuits for outputting the logical product.

The digital circuit 86 receives the first setting control signal and the resolution data, and supplies the logical product of the first setting control signal and the resolution data to the adder 82 and the digital circuit 84. The first setting control signal is, e.g. a digital signal which is represented by 0 or 1. The digital circuit 86 supplies the resolution data to the adder 82 if the first setting control signal is 1, whereas supplying the data which indicates a value of 0 to the adder 82 if the first setting control signal is 0. In the same way, the digital circuit 88 may be an AND circuit, and it supplies the logical product of the second setting control signal and the resolution data to the adder 82. The second setting control signal is, e.g. a digital signal which is represented by 0 or 1. In the same way, the digital circuit 88 supplies the logical product of the second setting control signal and the resolution data to the adder 82. The second setting control signal may be the same digital signal as the first setting control signal.

The adder 82 adds the data supplied from the digital circuits 86 and 88, and supplies it to the second multi-strobe resolution data setting unit 34*b* via the digital circuit 92. In other words, the adder 82 sets the data indicating value which is 0, 1 or 2 times as much as the resolution data set by the resolution data setting unit 60 as the second multi-strobe resolution data of the second multi-strobe resolution data setting unit 34*b* via the digital circuit 92 based on a combination of the first and second setting control signals. And the digital circuit 92 which is an AND circuit may output the logical product of a fourth setting control signal and the data outputted by the adder 82. In other words, the digital circuit 92 sets the second multi-strobe resolution data of the second multi-strobe resolution data setting unit 34*b* to be 0 if the fourth setting control signal is 1, whereas setting the data received from the adder 82 as the second multi-strobe resolution data of the second multi-strobe resolution data setting unit 34*b* if the fourth setting control signal is 0.

Meanwhile, the first multi-strobe resolution data setting unit 34*a* receives a value based on the resolution data from the resolution data setting unit 60 via the digital circuits 86 and 84. The digital circuit 84 which is an AND circuit sets the logical product of a third setting control signal and the resolution data as the first multi-strobe resolution data of the first multi-strobe resolution data setting unit 34a. In this embodiment, the third setting control signal is a digital signal, and the digital circuit 84 sets the data which indicates a value of 0 as the first multi-strobe resolution data of the first multi-strobe resolution data setting unit 34a if the third setting control signal is 1, whereas setting the data which indicates the same value as the resolution data in the first multi-strobe resolution data setting unit 34a if the fourth setting control signal is 0.

In this embodiment, if the first and second setting control signals are 1 and the third and fourth setting control signals are 0, the first multi-strobe resolution data setting unit 34a stores the data which indicates a value substantially half the data of the second multi-strobe resolution data setting unit 34b. The first and second variable delay circuit units 50a and 50b may be delay elements which have substantially the same delay amount as the resolution data of the resolution data setting unit 60. And the first and second variable delay circuit units 50a and 50b may be delay elements which have substantially the same delay amount as the least one of pieces of the resolution data capable of being set by the resolution data setting unit 60. And the first and second multi-strobe resolution setting units 34a and 34b may be registers for storing digital signals. In addition, the first and second multi-strobe resolution setting units 34a and 34b receive triggers for the control of their operation respectively. The triggers may be the reference clock.

The first and second basic timing data setting units 32a and 32b set the first and second basic timing data. The first and second basic timing data setting units 32a and 32b output the basic timing data which is set respectively to the variable delay amount calculating unit 40 in the form of 18-bit digital signals. The first and second basic timing data setting units 32a and 32b may be registers for storing digital signals. And the first and second basic timing data setting units 32a and 32b receive triggers for controlling the operation of them respectively. The triggers may be the reference clock.

The first multi-strobe resolution data setting unit 34a supplies the first multi-strobe resolution data to the first multi-strobe resolution data adding unit 36a. The first multi-strobe resolution data adding unit 36a adds the first multi-strobe resolution data to the second multi-strobe data stored in the multi-strobe data storing unit 38 whenever the reference clock generating unit 54 generates the reference clock. In other words, the first multi-strobe resolution data adding unit 36a adds the first multi-strobe resolution data to the second multi-strobe data outputted by the second multi-strobe resolution data adding unit 36b in the previous cycle. In this embodiment, the first multi-strobe resolution data adding unit 36a, as shown in FIG. 3, receives the second multi-strobe data of the previous cycle via the digital circuit 94.

The digital circuit 94 which is an AND circuit supplies the logical product of a fifth setting control signal and the second multi-strobe data of the previous cycle stored in the multi-strobe data storing unit 38 to the first multi-strobe resolution data adding unit 36a. The fifth setting control signal may be a digital signal. In other words, the digital circuit 94 may supply the second multi-strobe data to the first multi-strobe resolution data adding unit 36a if the fifth setting control signal is 0, whereas supplying the data which indicates a value of 0 to the first multi-strobe resolution data adding unit 36a if the fifth setting control signal is 1.

The second delay control unit 42b includes a second basic timing data setting unit 32b, a second multi-strobe resolution data setting unit 34b, a second variable delay calculating unit 40b, a second multi-strobe data calculating unit 46b, and a second multi-strobe resolution data adding unit 36b. The second basic timing data setting unit 32b may have the same function and configuration as the first basic timing data setting unit 32a described above.

The second multi-strobe resolution data setting unit 34b may have the same function and configuration as the first multi-strobe resolution data setting unit 34a described above. The second multi-strobe resolution data set in the second multi-strobe resolution data setting unit 34b, as described above, is given based on a combination of the first to fourth setting control signals. The second multi-strobe resolution data may be the data which indicates a value substantially twice the first multi-strobe resolution.

The second multi-strobe data calculating unit 46b may have the same function and configuration as the first multi-strobe data calculating unit 46a described above. In this embodiment, the second multi-strobe data calculating unit 46b includes a second multi-strobe resolution data adding unit 36b and a multi-strobe data storing unit 38. The second multi-strobe resolution data adding unit 36b adds the second multi-strobe resolution data to the second multi-strobe data of the previous cycle stored in the multi-strobe data storing unit 38 in response to the reference clock, and stores it in the multi-strobe data storing unit 38 as new second multi-strobe resolution data. The second multi-strobe resolution data adding unit 36b receives the second multi-strobe data stored in the multi-strobe data storing unit 38 via the digital circuit 96 as shown in FIG. 3. The digital circuit 96 which is an AND circuit supplies the logical product of a sixth setting control signal and the second multi-strobe data of the previous cycle stored in the multi-strobe data storing unit 38 to the second multi-strobe resolution data adding unit 36b. The sixth setting control signal may be a digital signal. In other words, the digital circuit 96 may supply the second multi-strobe data of the previous cycle to the second multi-strobe resolution data adding unit 36b if the sixth setting control signal is 0, whereas supplying the data which indicates a value of 0 to the second multi-strobe resolution data adding unit 36b if the sixth setting control signal is 1.

The multi-strobe data storing unit 38 stores the second multi-strobe data calculated by the second multi-strobe resolution data adding unit 36b of the second multi-strobe data calculating unit 46. The second multi-strobe resolution data adding unit 36b may be an adder circuit which includes a logic circuit for adding digital signals. In the initial state, the multi-strobe data storing unit 38 may be given a desired value as the initial value of the second multi-strobe data. In this embodiment, the multi-strobe data storing unit 38 is given zero as the initial value of the second multi-strobe data.

The first multi-strobe data calculating unit 46a outputs the first multi-strobe data stored in the first multi-strobe data storing unit 38 to the first variable delay amount calculating unit 40a in the form of 9-bit digital signals. The first multi-strobe data storing unit 38 may be a register for storing a digital signal. And the first multi-strobe data storing unit 38 receives a trigger for controlling the operation of the first multi-strobe data storing unit 38. The trigger may be the reference clock.

The first variable delay calculating unit 40a calculates the delay amount by which the reference clock is to be delayed in the first variable delay circuit unit 44a based on the first basic timing data and the first multi-strobe data calculated by the first multi-strobe data calculating unit 46a. According to the first delay amount control unit 42a as above, it is possible to easily generate the delay setting value which has increased by the first multi-strobe resolution data in response to the cycle of the reference clock.

In this embodiment, the first variable delay amount calculating unit 40a receives the 18-bit first basic timing data and the 9-bit first multi-strobe data, and adds the 9 bits of the first multi-strobe data to the low-order 9 bits of the first basic timing data. In another embodiment, the first variable delay amount calculating unit 40a may subtract the 9 bits of the first multi-strobe data from the low-order 9 bits of the first basic timing data. And the first delay control unit 42a may further include selecting means for selecting either addition or subtraction in the first variable delay amount calculating unit 40a. The first variable delay amount calculating unit 40a may include an adder logic circuit for performing addition of the first basic timing data and the first multi-strobe data and/or a subtractor logic circuit for performing subtraction of the first basic timing data and the first multi-strobe data. And the first variable delay amount calculating unit 40a may include a selecting unit for selecting either the adder or subtractor logic circuit and selecting whether to perform addition or subtraction. Moreover, the elements included in the timing generator 30 may operate based on the reference clock.

The second variable delay calculating unit 40b calculates the delay amount by which the reference clock is to be delayed in the second variable delay circuit unit 44b based on the second basic timing data and the second multi-strobe data stored in the multi-strobe data storing unit 38. The second basic timing data setting unit 32b may store arbitrary data as the second basic timing data. The second variable delay calculating unit 40b may have the same function and configuration as the first variable delay calculating unit 40a described above. According to the second delay amount control unit 42b as above, it is possible to easily generate the delay setting value which has increased by the second multi-strobe resolution data in response to the cycle of the reference clock.

The timing generating unit 56 generates the timing signal based on the first delay signal outputted by the first variable delay circuit unit 44a and the second delay signal outputted by the second variable delay circuit unit 44b. The timing generating unit 56 preferably generates the timing signals based on the signals interleaved with the first and second delay signals. In other words, the timing generating unit 56 preferably generates the timing signals, on the basis of the signal sequences of the first and second delay signals, where the delay signals of each of the signal sequences are arranged in turn without breaking the signal order of the signal sequences.

By the configuration of the timing generator 30 described above, it is possible to easily generate a plurality of timing signals (multi-strobe) whose phases are shifted by very small time intervals in response to the signals outputted by the electronic device 20. For example, if the setting value indicated by the first multi-strobe resolution data is substantially half the setting value of the second multi-strobe resolution data, it is possible to easily generate a multi-strobe whose phases are shifted by very small time intervals in response to the signals outputted by the electronic device 20. In this embodiment, the very small time intervals are determined based on the resolution data and the combination of control signals. In addition, it is possible to easily generate the multi-strobe of high resolution, which cannot be generated highly precisely with a single delay signal due to the characteristics of the element constituting the timing generator 30, by interleaving two delay signals. In this embodiment, the electronic device 20 outputs its output signal synchronously with the test cycle. According to the timing generator 30 of this embodiment, it is possible to easily generate a multi-strobe whose phases are shifted by very small time intervals in response to the output signals.

And the timing generator 30 may further include a basic timing data calculating unit for setting the basic timing data to increase or decrease gradually in the first and second basic timing data setting units 32a and 32b. The basic timing data calculating unit may have the same or similar functions and configurations as those of the multi-strobe calculating units 46a and 46b, the resolution data setting unit 60, the adder 82, the first and second multi-strobe resolution data setting units 34a and 34b, and the digital circuits (82, 84, 86, 88, and 92).

And according to the timing generator 30 of this embodiment, it is possible to easily adjust the phase of the multi-strobe to be the desired phase by adjusting the values of the first to sixth setting control signals. The timing generator 30 may include means for setting the second multi-strobe data stored in the multi-strobe data storing unit 38 to be zero based on the test pattern to test the electronic device 20. For example, the timing generator 30 may set the values of the first to sixth setting control signals to be predetermined values based on the test pattern to test the electronic device 20 and the second multi-strobe data stored in the multi-strobe data storing unit 38 to be zero.

And the pattern generator 30 may include means for setting new basic timing data in the first and second basic timing data setting units 32a and 32b at predetermined timing based on the test pattern to test the electronic device 20. In addition, the pattern generator 30 may include means for setting new multi-strobe resolution data in the first and second multi-strobe resolution data setting units 34a and 34b at predetermined timing based on the test pattern to test the electronic device 20. For example, the timing generator 30 may set the values of the first to sixth setting control signals to be predetermined values based on the test pattern to test the electronic device 20 and the first multi-strobe resolution data setting unit 34a and/or the second multi-strobe resolution data setting unit 34b to be the new multi-strobe resolution data.

The means for setting the new basic timing data and the new multi-strobe resolution data preferably sets the new basic timing data and the new multi-strobe resolution data, when a series of test cycle to test the electronic device 20 are completed. In other words, the means for setting the new basic timing data and the new multi-strobe resolution data preferably sets the setting value anew based on the multi-strobe which is to be generated by the timing generator 30 in the series of test cycle to test the electronic device 20. In addition, the pattern generating unit 10 (cf. FIG. 1) may include means for inputting a signal, which makes the first and second multi-strobe data calculating units 46a and 46b start to add the multi-strobe resolution data, to the first and second multi-strobe data calculating units 46a and 46b. When the first and second multi-strobe data calculating units 46a and 46b receive the signal for the start of addition of the multi-strobe resolution data, it starts the feedback of the second multi-strobe data of the previous cycle from the multi-strobe data storing unit 38 to the first and second multi-strobe resolution data adding units 36a and 36b. The signals for the start may be the fifth and sixth setting control signals. And the first multi-strobe resolution data may be substantially half the second multi-strobe resolution data. Hereafter, each of the setting control signals and an example of the operation of the multi-strobe data calculating unit 46 will be described by way of a timing chart.

Figure 4:
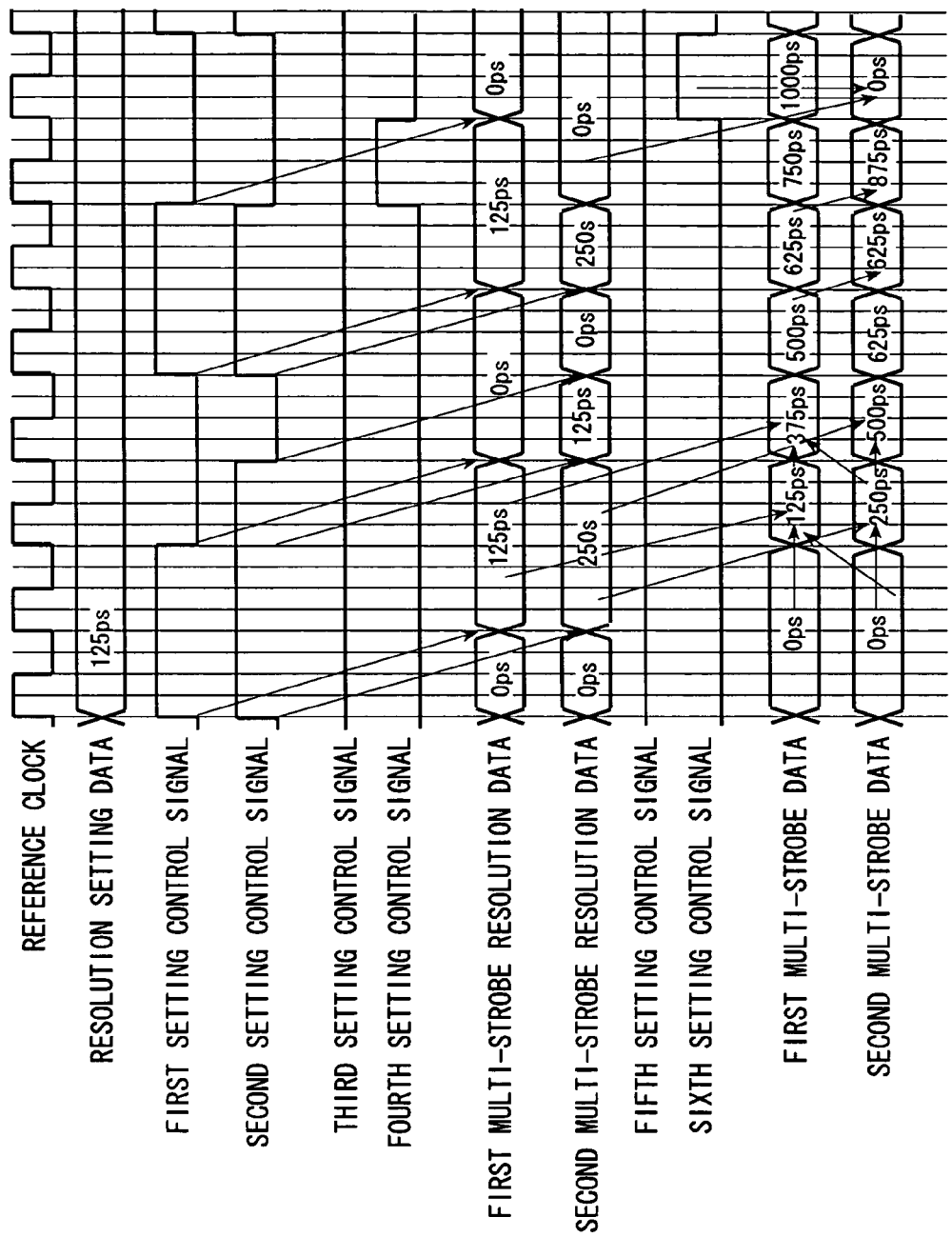
FIG. 4 is a timing chart showing an example of the operation of the timing generator.

FIG. 4 is a timing chart showing an example of the operation of the multi-strobe data calculating unit 46. In FIG. 4, the horizontal axis represents time, and one scale represents 2 ns (nano seconds). The reference clock row represents the reference clock generated by the reference clock generating unit 54, the resolution setting data row represents the resolution data set by the resolution data setting unit 60, each of the setting control signal rows represents the corresponding setting control signal respectively, each of the multi-strobe resolution data rows represents the multi-strobe resolution data set by the corresponding multi-strobe resolution data setting unit 34 respectively, and each of the multi-strobe data rows represents the multi-strobe data outputted by the corresponding multi-strobe data calculating unit 46 respectively.

In this embodiment, the resolution setting data as the initial state in the resolution setting unit 60 is set to be 125 ps. And one period of the reference clock is hereafter considered as one cycle. First, the first and second multi-strobe resolution data rows will be described.

The digital circuit 86 is inputted with 1 as the first setting control signal in the first cycle. In the same way, the digital circuit 88 is inputted with 1 as the second setting control signal in the first cycle. In this case, the adder 82 outputs the data which indicates a value twice as much as the resolution data of 125 ps, e.g. 250 ps to the digital circuit 92. The digital circuit 92 receives 1 which is an inverted signal of the fourth setting control signal, and outputs 250 ps. The first multi-strobe resolution data setting unit 34a, as shown in FIG. 4, receives 125 ps from the digital circuit 84 at the timing based on the rise of the reference clock the next cycle, and sets the value as the first multi-strobe resolution data. In the same way, the second multi-strobe resolution data setting unit 34b receives 250 ps from the digital circuit 92, and sets the value as the second multi-strobe resolution data.

As shown in FIG. 4, the first setting control signal becomes 0 when the third cycle begins. Accordingly, the digital circuit 86 supplies the data which indicates 0 to the first multi-strobe resolution data setting unit 34a via the digital circuit 84. The first multi-strobe resolution data setting unit 34a receives 0 ps from the digital circuit 84 in the fourth cycle which is the next cycle, and sets the value as the first multi-strobe resolution data. And the adder 82 supplies the sum of 0 ps which is the output of the digital circuit 88 and 125 ps which is the output of the digital circuit 86 to the second multi-strobe resolution data setting unit 34b via the digital circuit 92. The second multi-strobe resolution data setting unit 34b receives 125 ps from the digital circuit 92 in the fourth cycle, and sets the value as the second multi-strobe resolution data.

Then, when the fourth cycle begins, the second setting control signal becomes 0. Accordingly, the digital circuit 88 supplies the data indicating 0 to the adder 82. The adder 82 supplies 0 ps which is the output of the digital circuit 86 and 0 ps which is the output of the digital circuit 88 to the second multi-strobe resolution data setting unit 34b via the digital circuit 92. The second multi-strobe resolution data setting unit 34b sets 0 ps as the second multi-strobe resolution data in the fifth cycle.

Hereafter in the same way, if the third and fourth setting control signals are 0, the first and second multi-strobe resolution data is determined based on the combination of the first and second setting control signals. If the third setting control signal becomes 1, as shown in FIG. 4, the second multi-strobe resolution data is set to be 0 ps. And in the same way, if the fourth setting control signal becomes 0, the first multi-strobe resolution data is set to be 0 ps.

Next, the first multi-strobe data will be described. The first multi-strobe resolution data adding unit 36a outputs the sum of the data outputted by the digital circuit 94 and the first multi-strobe resolution data stored by the first multi-strobe resolution data setting unit 34a as the first multi-strobe data. The digital circuit 94 outputs the logical product of the second multi-strobe data stored in the multi-strobe data storing unit 38 and the inverted signal of the fifth setting control signal. If the fifth setting control signal is 0, the first multi-strobe data adding unit 36a outputs the sum of the second multi-strobe data of the previous cycle and the first multi-strobe resolution data. In other words, as shown in FIG. 4, if the fifth setting control signal is 0, the first multi-strobe resolution data adding unit 36a receives the first multi-strobe resolution data in the next cycle, and outputs the sum of the data and the second multi-strobe data of the previous cycle.

In this embodiment, as shown by the arrows in FIG. 4, it receives 125 ps as the first multi-strobe resolution data and 0 ps as the second multi-strobe data of the previous cycle in the third cycle, and outputs 125 ps as the first multi-strobe data of the present cycle. In this embodiment, the multi-strobe data storing unit 38 is given 0 ps as the initial value of the second multi-strobe data. In the fourth cycle, 125 ps is received as the first multi-strobe resolution data, 250 ps is received as the second multi-strobe data of the previous cycle, and 375 ps is outputted as the first multi-strobe data of the present cycle. If the fifth setting control signal is 0, hereafter in the same way, the first multi-strobe data is calculated and outputted. If the fifth setting control signal is 1, the first multi-strobe resolution data is outputted as the first multi-strobe data of the present cycle.

Next, the second multi-strobe data row will be described. The second multi-strobe resolution data adding unit 36b outputs the sum of the data outputted by the digital circuit 96 and the second multi-strobe resolution data stored by the second multi-strobe resolution data setting unit 34b as the new second multi-strobe data. The digital circuit 96 outputs, for example, the logical product of the second multi-strobe data of the previous cycle stored in the multi-strobe data storing unit 38 and the inverted signal of the sixth setting control signal. If the sixth setting control signal is 0, the second multi-strobe data adding unit 36b outputs the sum of the second multi-strobe data of the previous cycle and the second multi-strobe resolution data. In other words, as shown in FIG. 4, if the sixth setting control signal is 0, the second multi-strobe resolution data adding unit 36b receives the second multi-strobe resolution data in the next cycle, and outputs the sum of the data and the second multi-strobe data of the previous cycle.

In this embodiment, as shown by the arrows in FIG. 4, it receives 250 ps as the second multi-strobe resolution data and 0 ps as the second multi-strobe data of the previous cycle in the third cycle, and outputs 250 ps as the second multi-strobe data of the present cycle. In the fourth cycle, 250 ps is received as the second multi-strobe resolution data of the previous cycle, 250 ps is received as the second multi-strobe data of the previous cycle, and 500 ps is outputted as the second multi-strobe data of the present cycle. If the sixth setting control signal is 0, in the same way as other cycles, the second multi-strobe data is calculated and outputted. If the sixth setting control signal is 1, as shown by the eighth cycle in FIG. 4, the second multi-strobe resolution data is outputted as the second multi-strobe data of the present cycle.

Although the resolution setting data is 125 ps in this embodiment, it is obvious that other values may replace it. The resolution setting data indicates the resolution of the phase change of the timing signal generated by the timing generator 30. In other words, by changing the resolution setting data, the timing signal which has desired resolution of its phase change can be generated. And the basic timing data, like the multi-strobe resolution data, may also be set to be new delay amount based on the test pattern generated by the pattern generating unit 10. And although the timing generator 30 operates taking one period of the reference clock as one cycle in this embodiment, alternatively the timing generator 30 may operate taking an integer multiple of one period of the reference clock as one cycle.

And although the timing generator 30 includes the two variable delay circuit units 44 and generates the timing signals based on two delay signals in the two variable delay circuit units 44 in this embodiment, alternatively, the timing generator 30 may include a plurality of variable delay circuit units 44 and delay control units 42 and generate the timing signals based on a plurality of delay signals used in the variable delay circuit units 44. Each of pieces of the multi-strobe resolution data in the delay control units 42 may be given by an integer multiple of the reference value. And the multi-strobe resolution data adding units 36 of the delay control unit 42 preferably add each piece of the multi-strobe resolution data to the multi-strobe data outputted by the multi-strobe resolution data adding unit 36 and output it.

Figure 5:
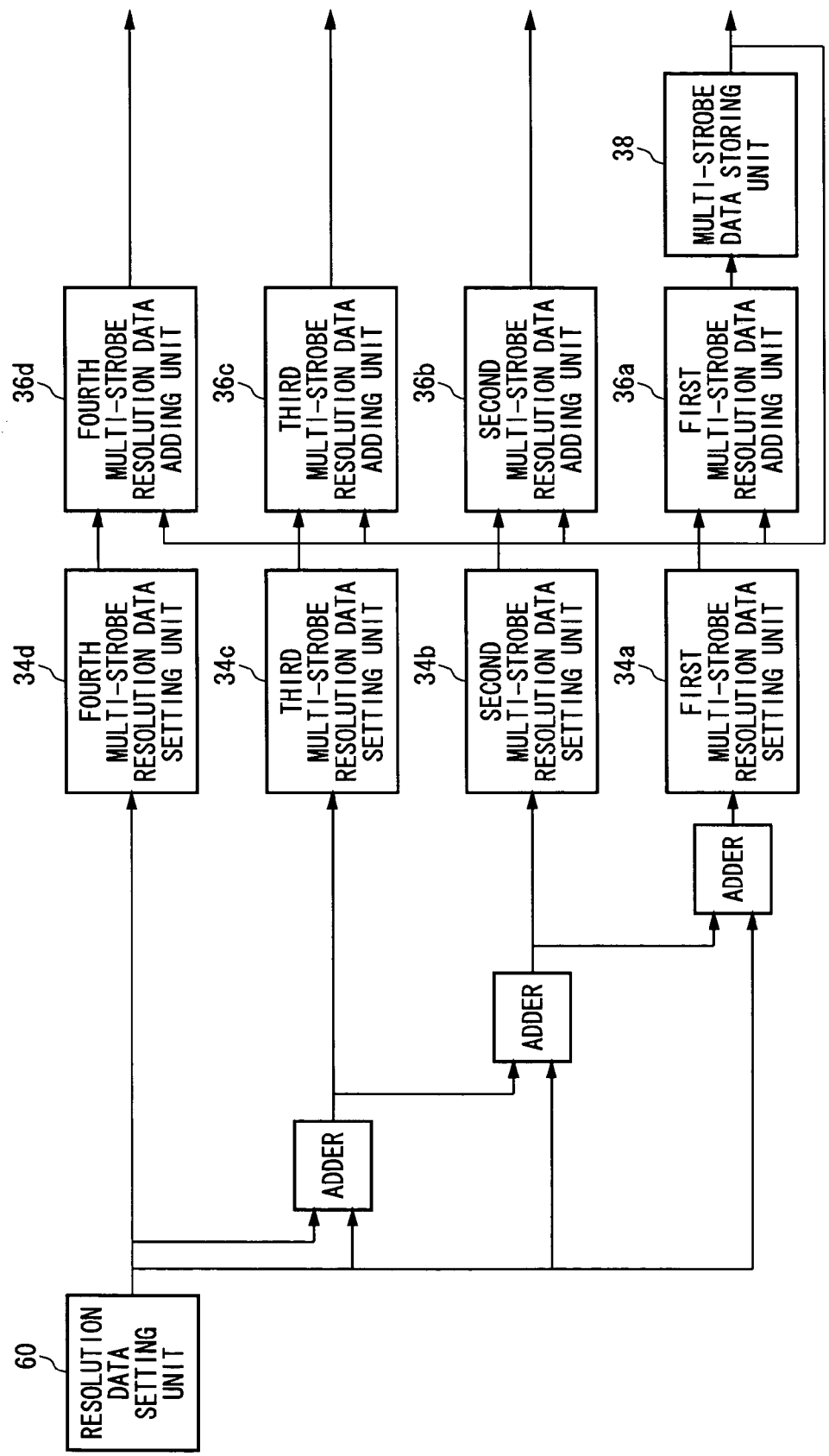
FIG. 5 shows pieces of multi-strobe data with regard to each of plurality of delay control units.

FIG. 5 shows an example of the configuration of the multi-strobe resolution data setting unit 34 and the multi-strobe data calculating unit 46 when interleaving a plurality of multi-strobes. The resolution data setting unit 60 is given a predetermined reference value. As shown in FIG. 5, the first multi-strobe resolution data setting unit 34a is given a value which is four times the reference value as the multi-strobe resolution data, the second multi-strobe resolution data setting unit 34b a value which is three times the reference value, the third multi-strobe resolution data setting unit 34c a value which is twice the reference value, the fourth multi-strobe resolution data setting unit 34d a value which is as much as the reference value respectively. And by the setting control signals and the digital circuits described in connection with FIG. 3, the multi-strobe resolution data set in each of the multi-strobe resolution data setting units 34 may be controlled to be a desired value.

The first multi-strobe resolution data adding unit 36a adds the first multi-strobe resolution data to the first multi-strobe data stored in the multi-strobe data storing unit 38 and outputs it. The multi-strobe data storing unit 38 stores the first multi-strobe data outputted by the first multi-strobe the adding unit 36a as new first multi-strobe data. The multi-strobe data storing unit 38 is given a predetermined value as the initial state. The second multi-strobe resolution data adding unit 36b adds the second multi-strobe resolution data to the first multi-strobe data stored in the multi-strobe data storing unit 38 and outputs it. The third multi-strobe resolution data adding unit 36c adds the third multi-strobe resolution data to the first multi-strobe data stored in the multi-strobe data storing unit 38 and outputs it. The fourth multi-strobe resolution data adding unit 36d adds the fourth multi-strobe resolution data to the first multi-strobe data stored in the multi-strobe data storing unit 38 and outputs it.

For example, if 125 ps is set in the resolution data setting unit 60 and 0 ps is stored in the multi-strobe data storing unit 38 as the initial state, 500 ps, 375 ps, 250 ps, and 125 ps are set in the first to fourth multi-strobe resolution data setting units respectively. The fourth multi-strobe resolution data adding unit 36d outputs 125 ps, the third multi-strobe resolution data adding unit 36c outputs 250 ps, the second multi-strobe resolution data adding unit 36b outputs 375 ps, and the first multi-strobe resolution data adding unit 36a outputs 500 ps. The multi-strobe data storing unit 38 stores 500 ps as the new multi-strobe data. Each of the multi-strobe resolution data adding units 36 calculates and outputs the multi-strobe data based on 500 ps stored anew. In other words, the fourth multi-strobe resolution data adding unit 36d outputs 625 ps, the third multi-strobe resolution data adding unit 36c outputs 750 ps, the second multi-strobe resolution data adding unit 36b outputs 875 ps, and the first multi-strobe resolution data adding unit 36a outputs 1000 ps. The multi-strobe data storing unit 38 stores 1000 ps anew as the multi-strobe data.

By repeating the operation as above, it is possible to easily generate the multi-strobe which has a plurality of timings whose phases are shifted by predetermined time intervals. And although the four kinds of the multi-strobe data are calculated in this embodiment, alternatively furthermore kinds of multi-strobe data may be calculated to generate the multi-strobe. In other words, it is obvious from the above description in this embodiment that this invention can be applied to a timing generator capable of generating the multi-strobes of high resolution where N (N is an arbitrary integer) of multi-strobes can be generated and interleaved respectively.

FIG. 6 shows another example of the configuration of the multi-strobe data calculating unit 46. Each of the multi-strobe data calculating units 46a and 46b includes a shift circuit 62, a selector 64, an adder 66, and a multi-strobe data storing unit 68. First, the operation of the multi-strobe data calculating unit 46a will be described.

The resolution data setting unit 60 has the same function as the resolution data setting unit 60 described in connection with FIGS. 3 and 5. The resolution data setting unit 60 sets a predetermined reference value which is the resolution data of the multi-strobe. The first shift circuit 62a receives the reference value from the resolution data setting unit 60 in the form of digital signals, shifts the digital signals to the left by 1 bit, and outputs the result to the first selector 64a. In other words, the first shift circuit 62a outputs a value which is twice the reference value (the resolution data) to the first selector 64a.

The first selector 64a receives the value twice the resolution data from the first shift circuit 62a and the resolution data from the resolution data setting unit 60. For example, the first selector 64a receives the data from the routes which are represented by 0 to 3 shown in FIG. 6. In this embodiment, the first selector 64a receives a value which is twice the resolution data from the route represented by 3, the resolution data from the routes represented by 2 and 1, and the data which indicates 0 from the route represented by 0. The first selector 64a selects the route which is represented by a predetermined number based on the data inputted to S0 and S1, and outputs the data received from the selected route to the first adder 66a. For example, the first selector 64a receives the digital signal represented by 0 or 1 through terminals S0 and S1, selects any of the routes 0 to 3 based on a combination of values of the digital signals inputted through S0 and S1, and outputs the data received from the selected route to the first adder 66a.

The adder 66a adds the data outputted by the first selector 64a and the data outputted by the digital circuit 72a, and supplies the added data to the first multi-strobe data storing unit 68a. The first multi-strobe data storing unit 68a outputs the data received from the adder 66a as the multi-strobe data. The digital circuit 72a receives the multi-strobe data outputted by the first multi-strobe data storing unit 68a in a previous strobe generation cycle (hereafter, referred to as previous cycle), and determines whether to supply the received multi-strobe data of the previous cycle to the adder 66a or not. The digital circuit 72a may be an AND circuit as shown in FIG. 6. In other words, the digital circuit 72a determines whether to supply the data which results from adding the data outputted by the first selector 64a to the multi-strobe data of the previous cycle or the data which is the same as the data outputted by the first selector 64a to the first multi-strobe data storing unit 68a.

The digital circuits 74a and 76b supply the signal for controlling the first selector 64a to select the route from which the data is received to the first selector 64a. The digital circuits 74a and 76b may be AND circuits as shown in FIG. 6. In other words, the digital circuits 74a and 76b supply the signals for data selection to the terminals S0 and S1 of the first selector 64a.

Each of the digital circuits 72a, 74a, and 76a receives the control signal. In this embodiment, the digital circuit 72a receives MUTCMD2_1st① and MUTCMD2_2nd②, the digital circuit 74a receives MUTCMD1_1st① and MUTCMD2_1st②, and the digital circuit 76a receives MUTCMD1_2nd②, MUTCMD2_1st①, and MUTCMD2_2nd②. In this embodiment, MUTCMD1_1st① and MUTCMD2_1st① are the control signals given to the multi-strobe data calculating unit 46a in the present cycle, and MUTCMD1_2nd② and MUTCMD2_2nd② are the control signals given to the multi-strobe data calculating unit 46b in the previous strobe generation cycle (hereafter, referred to as previous cycle). An example of a truth table of the values of MUTCMD1_1st①, MUTCMD1_2nd②, MUTCMD2_1st①, and MUTCMD2_2nd② and the multi-strobe data outputted by the multi-strobe data calculating unit 46a is shown in FIG. 6B.

Figures 6A, 6B:
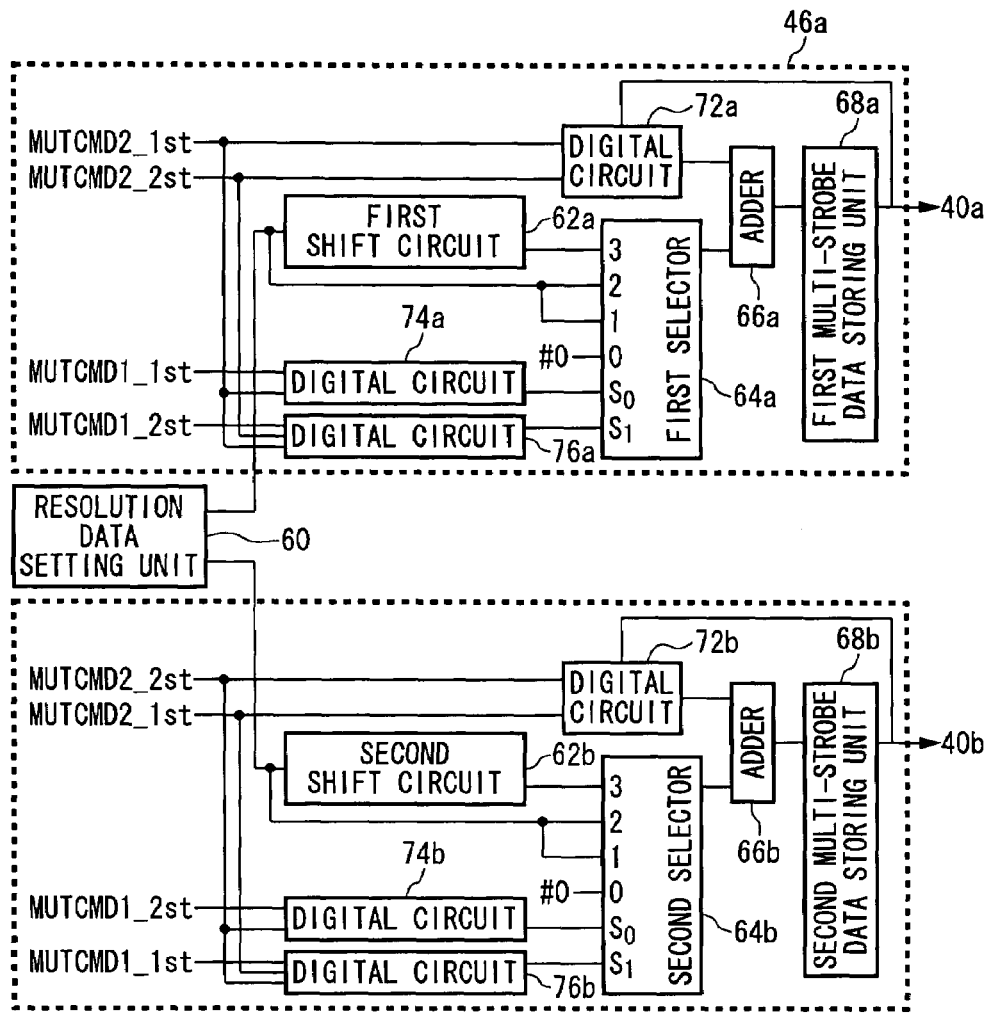
FIG. 6 shows another example of the configuration of the multi-strobe data calculating unit.

In the multi-strobe data calculating unit 46a, the present cycle MUTCMD1 shown in FIG. 6B indicates MUTCMD1_1st①, the previous cycle MUTCMD1 indicates MUTCMD1_2nd②, the present cycle MUTCMD2 indicates MUTCMD2_1st①, and the previous cycle MUTCMD2 indicates MUTCMD2_2nd②. And OFFSET DATA in FIG. 6B indicates the multi-strobe data outputted by the multi-strobe data calculating unit 46. In other words, OFFSET DATA indicates the delay amount of the variable delay circuit unit. And the previous value of OFFSET DATA is the multi-strobe data of the previous cycle, and the resolution data indicates the resolution data set in the resolution data setting unit 60.

Each of the digital circuit 72a, 74a, and 76a has a circuit configuration which satisfies the truth table shown in FIG. 6B. For example, if at least one of MUTCMD2_1st① and MUTCMD2_2nd② is 1, the digital circuit 72a outputs 0. In other words, as shown in the truth table, if at least one of MUTCMD2_1st① and MUTCMD2_2nd② is 1, the digital circuit 72b supplies the multi-strobe data of the previous cycle to the adder 66a.

The first selector 64a outputs the data received from the route represented by 3 if both S1 and S0 are inputted with 1, the data stored in the address 0 if both S1 and S0 are inputted with 0, and the data stored in the address 1 or 2 if S1 and S0 are inputted with different values. The digital circuits 74a and 76a receive the control signals described above, and supply the digital signal to the first selector 64a based on the control signal. Hereafter, the four upper rows of the truth table shown in FIG. 6B if both MUTCMD2_1st① and MUTCMD2_2nd② are 0 will be described.

If both MUTCMD1_1st① and MUTCMD1_2nd② are 0, as obvious from FIG. 6A, both the digital circuits 74a and 76a output 0. Accordingly, the first selector 64a supplies the data received from the route represented by 0, e.g. 0 to the adder 66a. If both MUTCMD1_1st① and MUTCMD1_2nd② have different values, as obvious from FIG. 6A, the digital circuits 74a and 76a output different values respectively. Accordingly, the first selector 64a supplies the data received from the route represented by 1 or 2, e.g. the resolution data to the adder 66a. If both MUTCMD1_1st① and MUTCMD1_2nd② are 1, as obvious from FIG. 6A, both the digital circuits 74a and 76a output 1. Accordingly, the first selector 64a outputs the data received from the route represented by 3, e.g. the data which is twice the resolution data.

If both MUTCMD2_1st① and MUTCMD2_2nd② are 0, the digital circuit 72a supplies the multi-strobe data of the previous cycle to the adder 66a. Accordingly, the multi-strobe data (OFFSET DATA) outputted by the first multi-strobe data storing unit 68a becomes the data shown in FIG. 6B.

Next, the four lower rows of the truth table shown in FIG. 6B if at least one of MUTCMD2_1st① and MUTCMD2_2nd② is 1 will be described. If at least one of MUTCMD2_1st① and MUTCMD2_2nd② is 1, the digital circuit 72a supplies 0 to the adder 66a.

If both MUTCMD2_1st① and MUTCMD2_2nd② are 1, both the digital circuits 74a and 76a output 0. Accordingly, the first selector 64a outputs the data received from the route represented by 0, e.g. 0 to the adder 66a. In this case, the multi-strobe data outputted by the first multi-strobe data storing unit 68a becomes 0 as shown by the eighth row of the truth table.

If MUTCMD2_1st① is 1 and MUTCMD2_2nd② is 0, both the digital circuits 74a and 76a output 0. Accordingly, the first selector 64a outputs the data received from the route represented by 0, e.g. 0 to the adder 66a. In this case, the multi-strobe data outputted by the first multi-strobe data storing unit 68a becomes 0 as shown by the seventh row of the truth table.

If MUTCMD2_1st① is 0 and MUTCMD2_2nd② is 1, the digital circuit 76a outputs 0. The digital circuit 74a outputs a different value by the value of MUTCMD1_1st①. In other words, the digital circuit 74a outputs 1 if MUTCMD1_1st① is 1, and outputs 0 if MUTCMD1_1ST is 0. If MUTCMD1_1st① is 1, the value outputted by the digital circuit 74a is different from the value outputted by the digital circuit 76a. Accordingly, the first selector outputs the data received from the route represented by 1 or 2, i.e. the resolution data to the adder 66b. Accordingly, the multi-strobe data outputted by the first multi-strobe data storing unit 68a becomes the resolution data as shown by the sixth row of the truth table. If MUTCMD1_1st① is 0, both the digital circuits 74a and 76a output 0. Accordingly, the multi-strobe data becomes 0 as shown by the fifth row of the truth table.

Although the multi-strobe data calculating unit 46a includes the digital circuit 72a, 74a, and 76a based on the truth table shown in FIG. 6B in this embodiment, alternatively the multi-strobe data calculating unit 46a may include the digital circuit 72a, 74a, and 76a based on other truth tables. According to the multi-strobe data calculating unit 46a described in this embodiment, since the multi-strobe data calculating unit 46a is given suitable control signals, like the multi-strobe data calculating unit 46 described in connection with FIGS. 2 to 4, it is possible to generate the multi-strobe data whose phases are shifted by very small intervals.

The multi-strobe data calculating unit 46b may have the same or similar function and configuration as the multi-strobe data calculating unit 46a. The multi-strobe data calculating unit 46b includes a second multi-strobe data storing unit 68b, an adder 66b, a second selector 64b, a second shift circuit 62b, a digital circuit 72b, a digital circuit 74b, and a digital circuit 76b. Each of the second multi-strobe data storing unit 68b, the adder 66b, the second selector 64b, the second shift circuit 62b, the digital circuit 72b, the digital circuit 74b, and the digital circuit 76b may have the same or similar function and configuration as the first multi-strobe data storing unit 68a, the adder 66a, the first selector 64a, the first shift circuit 62a, the digital circuit 72a, the digital circuit 74a, and the digital circuit 76a respectively. And the multi-strobe data calculating unit 46b may operate based on the truth table shown in FIG. 6B like the multi-strobe data calculating unit 46a. In the multi-strobe data calculating unit 46b, the present cycle MUTCMD1 indicates MUTCMD1_2nd①, the previous cycle MUTCMD1 indicates MUTCMD1_1st②, the present cycle MUTCMD2 indicates MUTCMD2_2nd①, and the previous cycle MUTCMD2 indicates MUTCMD2_1st②. According to the multi-strobe data calculating unit 46b described in this embodiment, since the multi-strobe data calculating unit 46b is given suitable control signals, like the multi-strobe data calculating unit 46a, it is possible to generate the multi-strobe data whose phases are shifted by very small time intervals. According to the multi-strobe data calculating unit 46 described in this embodiment, the circuit size can be made small in comparison to the multi-strobe data calculating unit 46 described in connection with FIG. 3. Hereafter, the operation of the multi-strobe data calculating units 46a and 46b will be described by way of a timing chart.

Figure 7:
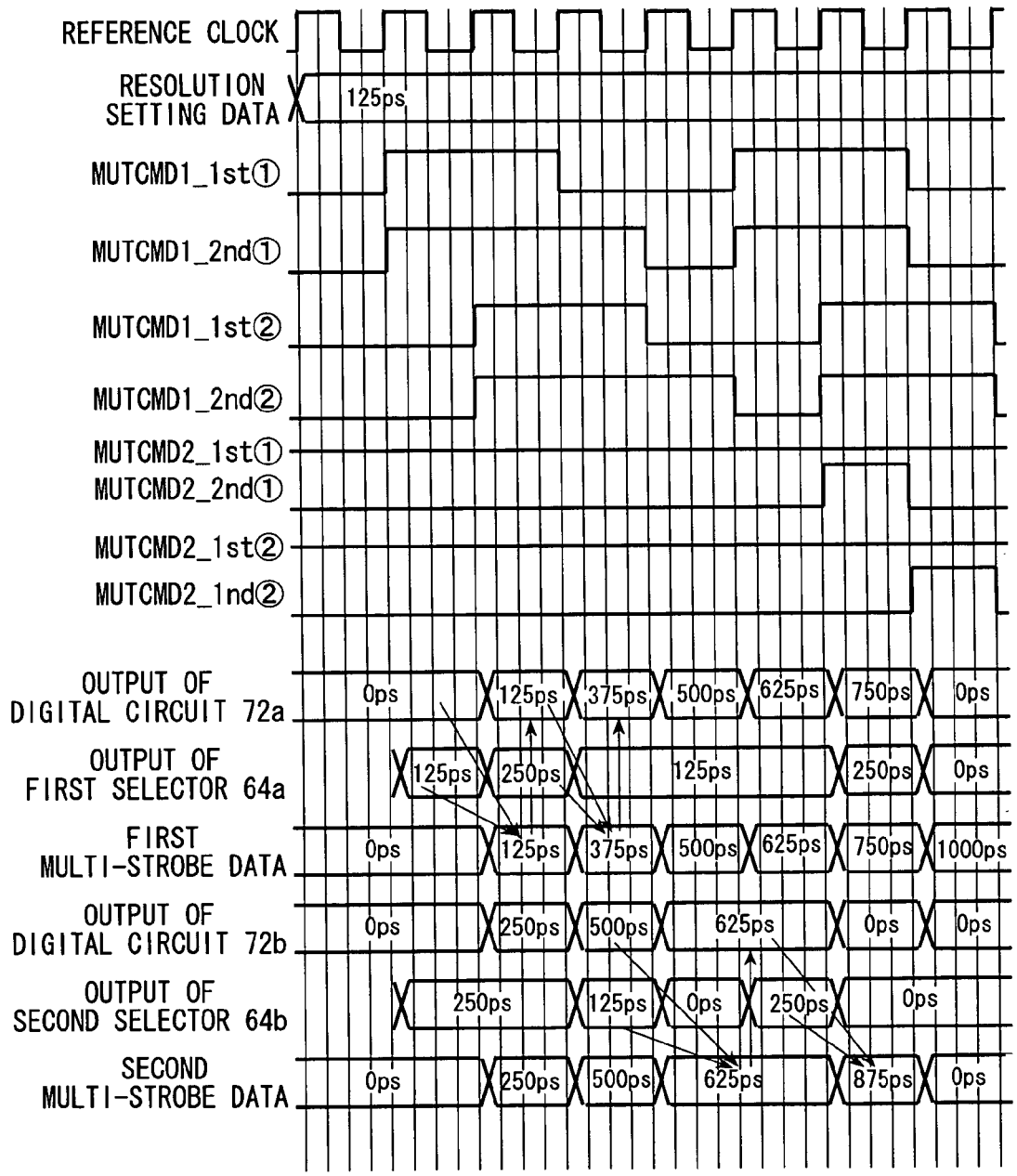
FIG. 7 shows a timing chart of an example of the operation of the timing generator.

FIG. 7 is a timing chart showing an example of the operation of the multi-strobe data calculating unit 46. In FIG. 7, the horizontal axis represents time, and one scale represents 2 ns (nano seconds). The reference clock row represents the reference clock generated by the reference clock generating unit 54, the resolution setting data row represents the resolution data set in the resolution data setting unit 60, each of the MUTCMD rows represents the corresponding MUTCMD signal, each of the rows of the outputs of the digital circuits 72 represents the corresponding output of the digital circuit 72, each of the rows of the outputs of the selectors 64 represents the corresponding output of the selector 64, and each of the multi-strobe data rows represents the multi-strobe data outputted by the corresponding multi-strobe data storing unit 68.

In this embodiment, the resolution setting data of the resolution setting unit 60 is set to be 125 ps as the initial state. And one period of the reference clock is hereafter considered as one cycle. Each of the MUTCMD rows is given by the value shown in FIG. 7. First, the rows of the outputs of the digital circuit 72a and the first selector 64a, and the first multi-strobe data row will be described.

In this embodiment, MUTCMD2_1st① and MUTCMD2_2nd② are always 0 as shown in FIG. 7. In this case, as described in connection with the truth table in FIG. 6B, the first selector 64a outputs a value based on the values of MUTCMD1_1st① and MUTCMD1_2nd②. In the second cycle, MUTCMD1_1st① is given by 1, and the first selector 64a outputs 125 ps which is the resolution data.

In the third cycle, both MUTCMD1_1st① and MUTCMD1_2nd② are given by 1, the first selector 64a outputs 250 ps which is twice the resolution data. Hereafter in the same way, the first selector 64a outputs 125 ps in the fourth to sixth cycles, 250 ps in the seven cycle, and 0 ps in the eighth and ninth cycles.

In the second cycle, the adder 66a outputs the data of 125 ps which results from adding 0 ps which is the output of the digital circuit 72a and 125 ps which is the output of the first selector 64a to the first multi-strobe data storing unit 68a. In the third cycle which is the next cycle, as shown in FIG. 7, the first multi-strobe data storing unit 68a outputs 125 ps as the multi-strobe data.

In this embodiment, since MUTCMD2_1st① and MUTCMD2_2nd② are always 0 as shown in FIG. 7, the digital circuit 72a outputs the multi-strobe data outputted by the first multi-strobe data storing unit 68a to the adder 66a. In the third cycle, the digital circuit 72a outputs 125 ps which is the multi-strobe data outputted by the first multi-strobe data storing unit 68a to the adder 66a. The adder 66a, as shown in FIG. 7, outputs the data which results from adding 125 ps which is the output of the digital circuit 72a and 250 ps which is the output of the first selector 64a to the first multi-strobe data storing unit 68a. The first multi-strobe data storing unit 68a, as shown in FIG. 7, outputs the data received from the adder 66a as the multi-strobe data in the fourth cycle which is the next cycle. In the same way, the first multi-strobe data storing unit 68a outputs the data shown in FIG. 7 in the fifth cycle and later. In the eighth cycle, MUTCMD2_2nd② is given by 1, and the output of the digital circuit 72a becomes 0 ps. And in the eighth cycle, MUTCMD2_2nd② is given by 1 while MUTCMD1_1st① is given by 1, and the output of the first selector 64a becomes 0 ps. In this case, from the next cycle, the test may be performed with other test patterns.

Next, the rows of the outputs of the digital circuit 72b and the second selector 64b, and the second multi-strobe data row will be described. In this embodiment, MUTCMD2_1st② is always 0 as shown in FIG. 7. The digital circuit 72b, as shown in FIG. 6, determines whether to supply the multi-strobe data outputted by the second multi-strobe data storing unit 68b to the adder 66b based on the values of MUTCMD2_2nd① and MUTCMD2_1st②. In this embodiment, as shown in FIG. 7, since MUTCMD2_1st② is always 0, the digital circuit 72b determines whether to supply the multi-strobe data to the adder 66b. As shown in the truth table of FIG. 6B, if MUTCMD2_2nd① is 0, the digital circuit 72b supplies the multi-strobe data outputted by the second multi-strobe data storing unit 68b in the previous cycle to the adder 66b. As shown in FIG. 7, MUTCMD2_2nd① is given by 1 in the seventh cycle, so the digital circuit 72b supplies 0 ps to the adder 66b in the seventh cycle, and in other cycles, the second multi-strobe data storing unit 68b supplies the multi-strobe data outputted in the previous cycle to the adder 66b.

The second selector 64b supplies the data to the adder 66b in accordance with the truth table shown in FIG. 6B based on MUTCMD2_2nd①, MUTCMD2_1st②, MUTCMD1_2nd①, and MUTCMD1_1st②. The operation of the second selector 64b is the same as the first selector 64a.

The second multi-strobe data storing unit 68b outputs the multi-strobe data shown in the second multi-strobe data row. The operation of the second multi-strobe data storing unit 68b is the same as the first multi-strobe data storing unit 68a. According to the multi-strobe data calculating unit 46 described above, it is possible to easily generate the multi-strobe which has a plurality of strobes where their timing varies at very small time intervals based on the first and second multi-strobe data.

Figure 8:
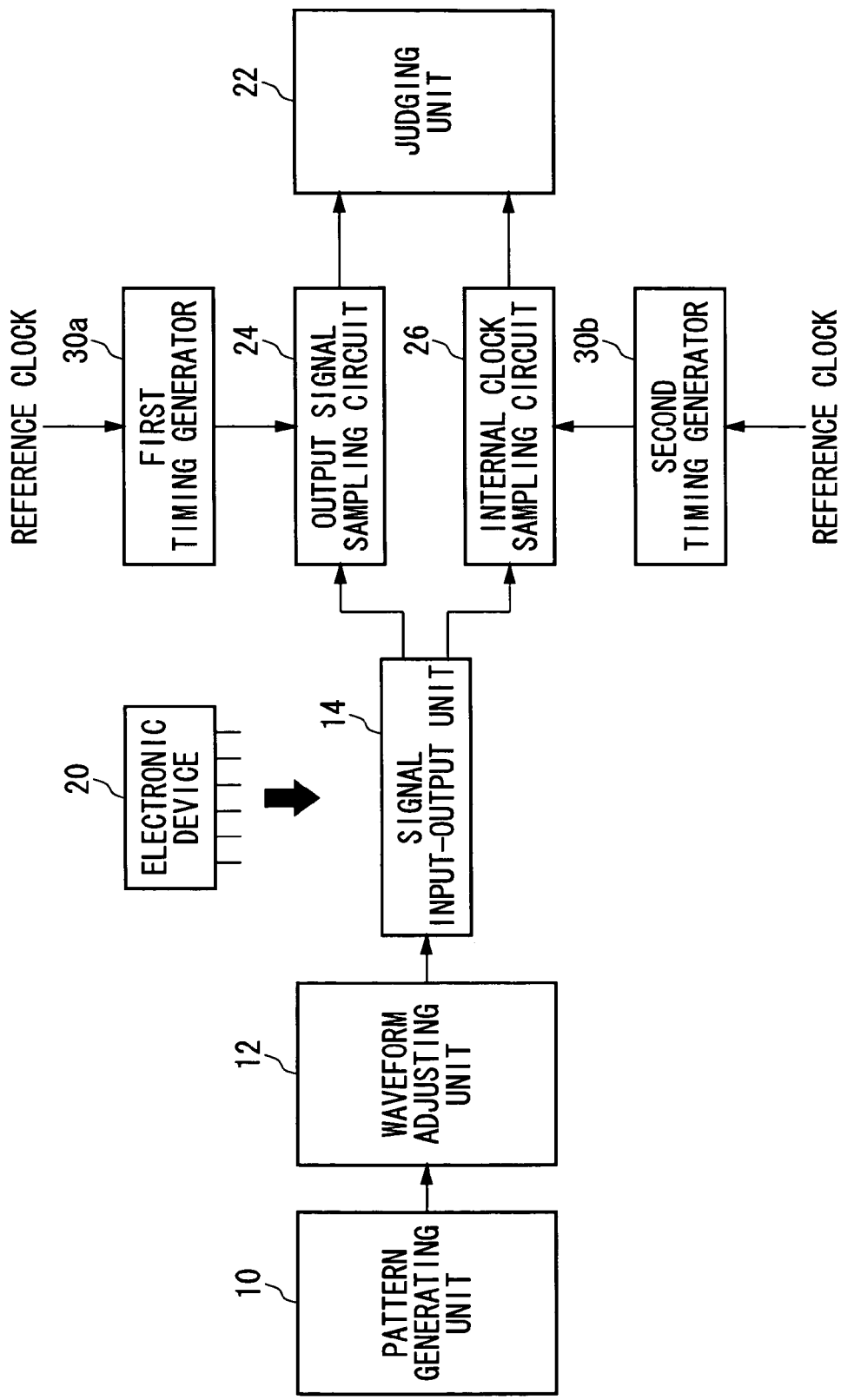
FIG. 8 shows another example of the configuration of the test apparatus according to this invention.

FIG. 8 shows another example of the configuration of the test apparatus 100 according to this invention. Matters in FIG. 8 given the same symbols as those in FIGS. 1 to 6 may have the same or similar function and configuration as those described in connection with FIGS. 1 to 6. The test apparatus 100 receives the output signal from the electronic device 20 in response to the data strobe which is a clock based on the internal clock of the electronic device 20. The test apparatus 100 includes a reference clock generating unit 54 for generating the reference clock, a pattern generating unit 10 for generating the test pattern synchronously with the reference clock, a waveform formatting unit 12 for formatting the test pattern, a signal input-output unit 14 for sending and/or receiving signals with the electronic device 20, a first timing generator 30a for generating the timing signal, a second timing generator 30b for generating the timing signal, an output signal sampling circuit 24 for sampling the output signal outputted by the electronic device 20, a data strobe sampling circuit 26 for sampling the data strobe, and a judging unit 22 for judging the quality of the electronic device 20.

The pattern generating unit 10 generates the test pattern for the test of the electronic device 20 with the reference clock, and inputs it to the electronic device 20 via the waveform formatting unit 12 and the signal input-output unit 14. The reference clock generating unit 54 generates the reference clock, and supplies it to the first and second timing generators 30a and 30b. The reference clock generating unit 54 preferably generates the reference clock based on the test pattern. The waveform formatting unit 12 formats the test pattern generated by the pattern generating unit 10. For example, the waveform formatting unit 12 inputs the formatted pattern which results from delaying the test pattern generated by the pattern generating unit 10 as much as a desired time to the signal input-output unit 14. The signal input-output unit 14 is electrically coupled to the electronic device 20, and inputs the formatted pattern received from the waveform formatting unit 12 to the electronic device 20. And the signal input-output unit 14 receives the output signal outputted by the electronic device 20 in response to the formatted pattern, and outputs it to the output signal sampling circuit 24. In addition, the signal input-output unit 14 receives the data strobe and outputs it to the data strobe sampling circuit 26.

The first timing generator 30a supplies a plurality of timing signals whose phases have been shifted by very small time intervals to the output signal sampling circuit 24 in response to the output signal of the electronic device 20. The output signal sampling circuit 24 samples the output signals outputted by the electronic device 20 in response to the test pattern at the timing based on the timing signals generated by the first timing generator 30a.

The second timing generator 30b supplies timing signals whose phases have been shifted by very small time intervals to the data strobe sampling circuit 26 in response to the data strobe. The data strobe sampling circuit 26 samples the data strobe at the timing based on the timing signals generated by the second timing generator 30b. The first and second timing generators 30a and 30b may have the same function and configuration as the timing generator 30 described in connection with FIGS. 1 to 6.

The judging unit 22 judges the quality of the electronic device 20 based on at least one of the sampling results of the output signal sampling circuit 24 and the data strobe sampling circuit 26. The judging unit 22 may include output signal jitter calculating means for calculating the jitter of the output signal outputted by the electronic device 20 based on the sampling result of the output signal sampling circuit 24. In addition, the judging unit 22 may include data strobe jitter calculating means for calculating the jitter of the data strobe based on the sampling result of the data strobe sampling circuit 26. And judging unit 20 may include output signal jitter calculating means for calculating the jitter of the output signal based on the sampling result of the output signal sampling circuit 26 and data strobe jitter calculating means for calculating the jitter of the data strobe based on the sampling result of the data strobe sampling circuit 28. In this case, the judging unit 22 may judge the quality of the electronic device 20 based on at least one of the sampling results of the output signal sampling circuit 24 and the data strobe sampling circuit 26 and the jitters of the output signal and the data strobe.

For example, the judging unit 22 may judges the quality of the electronic device 20 based on the jitter of the output signal calculated by the output signal jitter calculating means and the jitter of the data strobe calculated by the data strobe jitter calculating means. In other words, the judging unit 22 may compare a jitter reference value which is given in advance with the jitters of the output signal and the data strobe, and judge the quality of the electronic device 20. In this case, the output signal sampling circuit 24 preferably samples the output signals of the electronic device 20 a plurality of times at the timing based on each of the timing signals whose received phases are different. The output signal jitter calculating means may compare the plurality of sampling results at the timing based on each of the timing signals whose phases are different with the reference value which is given in advance, and calculate the jitter of the output signal of the electronic device 20 based on how many times the sampling results at the timing based on each of the timing signals whose phases are different are more than the reference value.

And the data strobe sampling circuit 26 preferably samples the data strobe of the electronic device 20 a plurality of times at the timing based on each of the timing signals whose received phases are different. The data strobe jitter calculating means may compare the plurality of sampling results at the timing based on each of the timing signals whose phases are different with the reference value which is given in advance, and calculate the jitter of the data strobe of the electronic device 20 based on how many times the sampling results at the timing based on each of the timing signals whose phases are different are more than the reference value. And the judging unit 22 is given a plurality of different jitter reference values, so that it may compare the jitter reference values with the calculated jitter and judge the quality of the electronic device 20 in response to each of the jitter reference values. In other words, the judging unit 22 may judge the quality of the electronic device 20 based on the calculated jitter.

In another embodiment, the judging unit 22 may judge the quality of the electronic device 20 based on the sampling results of the output signal sampling circuit 24 and the data strobe sampling circuit 26. For example, the judging unit 22 may judge the quality of the electronic device 20 based on whether a criterion with regard to the Setup/Hold timing of data is satisfied or not. For example, the judging unit 22 may judge the quality of the electronic device 20 based on the timing at which the output signal of the electronic device 20 becomes the reference value of the output signal given in advance and the timing at which the data strobe becomes the reference value of the data strobe given in advance. The judging unit 22 may judge the quality of the electronic device 20 based on the relation between the timing at which the output signal of the electronic device 20 becomes the reference value of the output signal given in advance and the timing at which the data strobe becomes the reference value of the data strobe given in advance.

The first timing generator 30a includes first and second variable delay circuit units 44a and 44b and first and second delay control units 42a and 42b, and the second timing generator 30b includes third and fourth variable delay circuit units 44c and 44d and third and fourth delay control units 42c and 42d. The first and third variable delay circuit units 44a and 44c may have the same function and configuration as the first variable delay circuit unit 44a described in connection with FIGS. 2 to 4. The second and fourth variable delay circuit units 44b and 44d may have the same function and configuration as the second variable delay circuit unit 44b described in connection with FIGS. 2 to 4. Moreover, the first and third delay control units 42a and 42c may have the same function and configuration as the first delay control unit 42a described in connection with FIGS. 2 to 6. Moreover, the second and fourth delay control units 42b and 42d may have the same function and configuration as the second delay control unit 42b described in connection with FIGS. 2 to 6.

According to the test apparatus 100 as above, it is possible to easily generate a plurality of timing signals whose phases are shifted by very small time intervals in response to the output signal or the data strobe the electronic device 20. Therefore, it is possible to easily sample the output signal or the data strobe of the electronic device 20 at the timing based on the plurality of timing signals whose phases are different. In addition, since it is unnecessary to have the phase data of the sampling timing signals whose phases are different for each of the sampling timing signals, the load of the storage capacity of the test apparatus 100 can be reduced.

Although the present invention has been described by way of exemplary embodiments, it should be understood that those skilled in the art might make many changes and substitutions without departing from the spirit and the scope of the present invention, which is defined only by the appended claims.

As obvious from the description above, according to the test apparatus 100 of the present invention, it is possible to easily generate a plurality of timing signals whose phases are shifted by very small time intervals and to easily sample the output signal or the data strobe of the electronic device 20 at the timing based on a plurality of timing signals whose phases are different.

What is claimed is:

1. A timing generator for generating a timing signal, comprising:
   a reference clock generating unit for outputting a reference clock at a predetermined time interval;
   a first variable delay circuit unit for receiving said reference clock and outputting a first delay signal which results from delaying said reference clock;
   a second variable delay circuit unit for receiving said reference clock and outputting a second delay signal which results from delaying said reference clock;
   a first delay control unit for controlling a delay amount of said first variable delay circuit unit;
   a second delay control unit for controlling a delay amount of said second variable delay circuit unit; and
   a timing generating unit for generating said timing signal based on said first and second delay signals,
   wherein said first and second delay control units calculate said delay amounts of said first and second variable delay circuit units to be calculated whenever said reference clock generating unit generates said reference clock.

2. A timing generator as claimed in claim 1, wherein said timing generating unit generates said timing signal based on a signal interleaved with said first and second delay signals.

3. A timing generator as claimed in claim 1, wherein said first delay control unit comprises:
   a first basic timing data setting unit to which a first basic timing data is set in advance;
   a first multi-strobe resolution data setting unit to which a first multi-strobe resolution data is set in advance;
   a first multi-strobe data calculating unit for calculating first multi-strobe data based on said first multi-strobe resolution data in response to said reference clock; and
   a first variable delay calculating unit for calculating said delay amount by which said reference clock is to be delayed in said first variable delay circuit unit based on said first basic timing data and said first multi-strobe data, and said second delay control unit comprises:
   a second basic timing data setting unit to which a second basic timing data is set in advance;
   a second multi-strobe resolution data setting unit to which a second multi-strobe resolution data is set in advance;
   a second multi-strobe data calculating unit for calculating second multi-strobe data based on said second multi-strobe resolution data in response to said reference clock; and
   a second variable delay calculating unit for calculating said delay amount by which said reference clock is to be delayed in said second variable delay circuit unit based on said second basic timing data and said second multi-strobe data.

4. A timing generator as claimed in claim 3, wherein said first variable delay calculating unit calculates said delay amount which results from adding said first multi-strobe data to said first basic timing data, and
said second variable delay calculating unit calculates said delay amount which results from adding said second multi-strobe data to said second basic timing data.

5. A timing generator as claimed in claim 3, wherein said first variable delay calculating unit calculates said delay amount which results from subtracting said first multi-strobe data from said first basic timing data, and said second variable delay calculating unit calculates said delay amount which results from subtracting said second multi-strobe data from said second basic timing data.

6. A timing generator as claimed in claim 3, wherein said second delay control unit further comprises:
   a multi-strobe data storing unit for storing said second multi-strobe data calculated by said second multi-strobe data calculating unit; and
   a second multi-strobe resolution data adding unit for adding said second multi-strobe resolution data to said second multi-strobe data stored by said multi-strobe data storing unit whenever said reference clock generating unit generates said reference clock,
   said first delay control unit further comprises a first multi-strobe resolution data adding unit for adding said first multi-strobe resolution data to said second multi-strobe data stored by said multi-strobe data storing unit whenever said reference clock generating unit generates said reference clock,
   said multi-strobe data storing unit stores said second multi-strobe data anew to which said second multi-strobe resolution data has been added by said second multi-strobe resolution data adding unit, said second variable delay calculating unit calculates said delay amount by which said reference clock is delayed in said second variable delay circuit unit based on said second basic timing data and said second multi-strobe data stored by said multi-strobe data storing unit, and said first variable delay calculating unit calculates said delay amount by which said reference clock is delayed in said first variable delay circuit unit based on said first basic timing data and said delay amount calculated by said first multi-strobe resolution data adding unit.

7. A timing generator as claimed in claim 3, wherein said first multi-strobe resolution data is substantially half said second multi-strobe resolution data.

8. A timing generator as claimed in claim 3, further comprising means for setting said second multi-strobe data stored by said multi-strobe data storing unit to be zero based on said timing signal which is to be generated by said timing generator.

9. A timing generator as claimed in claim 3, further comprising:
   means for setting new first basic timing data in said first basic timing data setting unit based on said timing signal which is to be generated by said timing generator, and
   means for setting new second basic timing data in said second basic timing data setting unit based on said timing signal which is to be generated by said timing generator.

10. A timing generator as claimed in claim 3, further comprising:
    means for setting new first multi-strobe resolution data in said first multi-strobe resolution data setting unit based on said timing signal which is to be generated by said timing generator, and
    means for setting new second multi-strobe resolution data in said second multi-strobe resolution data setting unit based on said timing signal which is to be generated by said timing generator.

11. A test apparatus for testing an electronic device, comprising:
    a pattern generating unit for generating a test pattern to test said electronic device;
    a waveform formatting unit for receiving said test pattern and inputting a formatted pattern which results from formatting said test pattern to said electronic device;
    a first timing generator for generating a timing signal;
    an output signal sampling circuit for sampling an output signal outputted by said electronic device in response to said test pattern at timing based on said timing signal generated by said first timing generator; and
    a judging unit for judging quality of said electronic device based on a sampling result of said output signal sampling circuit;
    wherein said first timing generator comprises:
    a reference clock generating unit for outputting a reference clock at a predetermined time interval;
    a first variable delay circuit unit for receiving said reference clock and outputting a first delay signal which results from delaying said reference clock;
    a second variable delay circuit unit for receiving said reference clock and outputting a second delay signal which results from delaying said reference clock;
    a first delay control unit for controlling a delay amount of said first variable delay circuit unit;
    a second delay control unit for controlling a delay amount of said second variable delay circuit unit; and
    a first timing generating unit for generating said timing signal based on said first and second delay signals,
    wherein said first and second delay control units calculate said delay amounts of said first and second variable delay circuit units to be calculated whenever said reference clock generating unit generates said reference clock.

12. A test apparatus as claimed in claim 11, wherein said judging unit comprises means for calculating jitter of said output signal based on said sampling result of said output signal sampling circuit, and judges quality of said electronic device further based on said jitter of said output signal.

13. A test apparatus as claimed in claim 11, further comprising:
    a second timing generator for generating a timing signal; and
    a data strobe sampling circuit for sampling a data strobe at timing based on said timing signal generated by said second timing generator,
    wherein said electronic device outputs said output signal in response to an internal clock,
    said output signal sampling circuit receives said output signal in response to said data strobe which is a clock based on said internal clock,
    said second timing generator comprises:
    a third variable delay circuit unit for receiving said reference clock and outputting a third delay signal which results from delaying said reference clock;
    a fourth variable delay circuit unit for receiving said reference clock and outputting a fourth delay signal which results from delaying said reference clock;
    a third delay control unit for controlling a delay amount of said third variable delay circuit unit;
    a fourth delay control unit for controlling a delay amount of said fourth variable delay circuit unit; and
    a second timing generating unit for generating said timing signal based on said third and fourth delay signals,
    said third and fourth delay control units calculate said delay amounts of said third and fourth variable delay circuit units to be calculated whenever said reference clock generating unit generates said reference clock, and
    said judging unit judges quality of said electronic device further based on a sampling result of said data strobe sampling circuit.

14. A test apparatus as claimed in claim 13, wherein said judging unit further comprises means for calculating jitter of said data strobe based on said sampling result of said data strobe sampling circuit, and judges quality of said electronic device further based on said jitter of said data strobe.

* * * * *